(12) United States Patent
Huang et al.

(10) Patent No.: US 7,910,223 B2
(45) Date of Patent: *Mar. 22, 2011

(54) PLANARIZATION FILMS FOR ADVANCED MICROELECTRONIC APPLICATIONS AND DEVICES AND METHODS OF PRODUCTION THEREOF

(75) Inventors: Wei Huang, San Jose, CA (US); Joseph Kennedy, San Jose, CA (US); Ronald Katsanes, Newark, CA (US)

(73) Assignee: Honeywell International Inc., Morristown, NJ (US)

( * ) Notice: Subject to any disclaimer, the term of this patent is extended or adjusted under 35 U.S.C. 154(b) by 705 days.

This patent is subject to a terminal disclaimer.

(21) Appl. No.: 10/518,201

(22) PCT Filed: Oct. 27, 2003

(86) PCT No.: PCT/US03/34347
§ 371 (c)(1),
(2), (4) Date: Oct. 6, 2005

(87) PCT Pub. No.: WO2005/017617
PCT Pub. Date: Feb. 24, 2005

(65) Prior Publication Data
US 2006/0106160 A1    May 18, 2006

Related U.S. Application Data

(60) Provisional application No. 60/488,484, filed on Jul. 17, 2003.

(51) Int. Cl.
*B32B 27/42* (2006.01)
*B28B 19/00* (2006.01)
*G03F 7/00* (2006.01)
*C08G 8/04* (2006.01)

(52) U.S. Cl. ..... 428/524; 427/96.1; 427/97.1; 427/99.3; 430/270.1; 524/509

(58) Field of Classification Search ............... 524/509; 528/154, 501; 427/96; 428/524; 430/270.1
See application file for complete search history.

(56) References Cited

U.S. PATENT DOCUMENTS

| | | | |
|---|---|---|---|
| 3,930,868 A | 1/1976 | Muzyczko et al. | 96/115 |
| 3,933,677 A | 1/1976 | Aufdermarsh, Jr. | 252/188.3 |
| 3,935,339 A | 1/1976 | Cooke, Jr. | 427/216 |
| 3,954,684 A | 5/1976 | Farrissey, Jr. et al. | 260/2.5 |
| 3,986,991 A | 10/1976 | Kolakowski et al. | 260/2.5 |
| 3,998,765 A | 12/1976 | Novak et al. | 260/2.5 |
| 4,011,180 A | 3/1977 | Lockwood et al. | 260/2.5 |
| 4,039,487 A | 8/1977 | Kolakowski et al. | 260/2.5 |
| 4,058,403 A | 11/1977 | Funabiki et al. | 106/56 |
| 4,066,628 A | 1/1978 | Ashida et al. | 260/77.5 |
| 4,074,760 A | 2/1978 | Copeland et al. | 166/276 |
| 4,075,139 A | 2/1978 | Greer | 260/2.5 |
| 4,081,030 A | 3/1978 | Carpenter et al. | 166/276 |
| 4,092,296 A | 5/1978 | Skiff | 260/47 |
| 4,101,465 A | 7/1978 | Lockwood et al. | 521/118 |
| 4,101,474 A | 7/1978 | Copeland et al. | 260/13 |
| 4,118,535 A | 10/1978 | Banucci et al. | 428/383 |
| 4,151,219 A | 4/1979 | Brewbaker et al. | 260/836 |
| 4,156,612 A | 5/1979 | Muzyczko et al. | 96/115 |
| 4,163,030 A | 7/1979 | Banucci et al. | 525/429 |
| 4,165,413 A | 8/1979 | Sefton et al. | 521/128 |
| 4,197,128 A | 4/1980 | Watanabe et al. | 430/193 |
| 4,199,651 A | 4/1980 | Banucci et al. | 428/458 |
| 4,207,106 A | 6/1980 | Odawara et al. | 430/165 |
| 4,217,407 A | 8/1980 | Watanabe et al. | 430/166 |
| 4,254,006 A | 3/1981 | Robertson | 260/31.8 |
| 4,256,799 A | 3/1981 | Ohashi et al. | 428/215 |
| 4,259,430 A | 3/1981 | Kaplan et al. | 430/191 |
| 4,268,608 A | 5/1981 | Muzyczko et al. | 430/270 |
| 4,288,565 A | 9/1981 | Lohse et al. | 521/135 |
| 4,292,353 A | 9/1981 | Ohashi et al. | 428/211 |
| 4,292,361 A | 9/1981 | Ohashi et al. | 428/215 |
| 4,292,369 A | 9/1981 | Ohashi et al. | 428/313 |
| 4,304,700 A | 12/1981 | Shimp et al. | 260/29.2 |
| 4,323,658 A | 4/1982 | Speranza et al. | 521/174 |
| 4,332,600 A | 6/1982 | Wegerhoff et al. | 65/2 |
| 4,332,601 A | 6/1982 | Wegerhoff et al. | 65/2 |
| 4,332,923 A | 6/1982 | Rainear | 525/507 |
| 4,338,232 A | 7/1982 | Harris et al. | 523/414 |
| 4,403,079 A | 9/1983 | Uhrig et al. | 525/507 |
| 4,451,550 A | 5/1984 | Bennett et al. | 430/176 |
| 4,460,674 A | 7/1984 | Uehara et al. | 430/190 |
| 4,467,027 A | 8/1984 | Yamamoto et al. | 430/302 |

(Continued)

FOREIGN PATENT DOCUMENTS

| | | | |
|---|---|---|---|
| EP | 03777970.9 | | 8/2007 |
| FR | 2801602 | * | 6/2001 |
| RU | 1364051 A1 | * | 7/1996 |
| WO | 96/02066 A | | 1/1996 |
| WO | 00/38016 A | | 6/2000 |

(Continued)

*Primary Examiner* — Tae H Yoon

(57) ABSTRACT

A planarization composition is disclosed herein that comprises: a) a structural constituent; and b) a solvent system, wherein the solvent system is compatible with the structural constituent and lowers the lowers at least one of the intermolecular forces or surface forces components of the planarization composition. A film that includes this planarization composition is also disclosed. In addition, another planarization composition is disclosed herein that comprises: a) a cresol-based polymer compound; and b) a solvent system comprising at least one alcohol and at least one ether acetate-based solvent. A film that includes this planarization composition is also disclosed. A layered component is also disclosed herein that comprises: a) a substrate having a surface topography; and b) a planarization composition or a film such as those described herein, wherein the composition is coupled to the substrate. Methods of forming a planarization compositions are also disclosed herein that comprise: a) providing a structural constituent; b) providing a solvent system, wherein the solvent system is compatible with the structural constituent and lowers at least one of the intermolecular forces or surface forces components of the planarization composition; and c) blending the structural constituent and the solvent system to form a planarization composition. Methods of forming a film are also disclosed that comprise: a) providing a planarization composition such as those disclosed herein; and b) evaporating at least part of the solvent system to form a film.

9 Claims, 19 Drawing Sheets

U.S. PATENT DOCUMENTS

| | | | | |
|---|---|---|---|---|
| 4,469,776 A | 9/1984 | Matsumoto et al. | | 430/309 |
| 4,471,019 A | 9/1984 | Wegerhoff et al. | | 428/224 |
| 4,499,171 A | 2/1985 | Hosaka et al. | | 430/192 |
| 4,499,175 A | 2/1985 | Curtis et al. | | 430/253 |
| 4,507,428 A | 3/1985 | Higginbottom et al. | | 524/596 |
| 4,513,060 A | 4/1985 | Vasta | | 428/416 |
| 4,513,077 A | 4/1985 | Isobe et al. | | 430/270 |
| 4,526,856 A | 7/1985 | Lewis et al. | | 430/191 |
| 4,530,948 A | 7/1985 | Cavitt et al. | | 523/454 |
| 4,533,713 A | 8/1985 | Howells | | 528/26 |
| 4,539,347 A | 9/1985 | DeGooyer | | 523/404 |
| 4,544,801 A | 10/1985 | Rudik et al. | | 174/68.5 |
| 4,553,596 A | 11/1985 | Graham et al. | | 166/295 |
| 4,557,979 A | 12/1985 | Higginbottom et al. | | 428/460 |
| 4,572,870 A | 2/1986 | Vasta | | 428/416 |
| 4,588,419 A | 5/1986 | Caul et al. | | 51/295 |
| 4,593,078 A | 6/1986 | Kooymans et al. | | 525/497 |
| 4,604,436 A | 8/1986 | Thorpe et al. | | 525/504 |
| 4,613,561 A | 9/1986 | Lewis | | 430/326 |
| 4,614,775 A | 9/1986 | Bekooij et al. | | 525/533 |
| 4,617,165 A | 10/1986 | Tsang et al. | | 264/236 |
| 4,621,042 A | 11/1986 | Pampalone et al. | | 430/271 |
| 4,624,998 A | 11/1986 | Keil | | 525/476 |
| 4,626,474 A | 12/1986 | Kim | | 428/416 |
| 4,650,743 A | 3/1987 | Galloway | | 430/278 |
| 4,659,649 A | 4/1987 | Dickinson et al. | | 430/280 |
| 4,661,436 A | 4/1987 | Lewis et al. | | 430/326 |
| 4,671,883 A | 6/1987 | Connell et al. | | 252/8.515 |
| 4,686,248 A | 8/1987 | Bekooij et al. | | 523/404 |
| 4,690,955 A | 9/1987 | Kilgour et al. | | 521/112 |
| 4,699,658 A | 10/1987 | Okada et al. | | 106/21 |
| 4,699,659 A | 10/1987 | Okada et al. | | 106/21 |
| 4,699,931 A | 10/1987 | Fuzesi et al. | | 521/117 |
| 4,710,449 A | 12/1987 | Lewis et al. | | 430/326 |
| 4,711,911 A | 12/1987 | Blount | | 521/123 |
| 4,732,702 A | 3/1988 | Yamazaki et al. | | 252/512 |
| 4,738,995 A | 4/1988 | Kooijmans et al. | | 523/404 |
| 4,746,683 A | 5/1988 | Kilgour | | 521/112 |
| 4,759,970 A | 7/1988 | Seeger, Jr. et al. | | 428/209 |
| 4,762,771 A | 8/1988 | Matsumoto et al. | | 430/302 |
| 4,766,158 A | 8/1988 | Fuzesi et al. | | 521/110 |
| 4,769,174 A | 9/1988 | Kilgour | | 252/351 |
| 4,769,437 A | 9/1988 | Blount | | 528/95 |
| 4,772,407 A | 9/1988 | Carlson | | 252/74 |
| 4,772,669 A | 9/1988 | van Iperen et al. | | 525/484 |
| 4,774,136 A | 9/1988 | Okada et al. | | 428/402.2 |
| 4,784,937 A | 11/1988 | Tanaka et al. | | 430/331 |
| 4,785,884 A | 11/1988 | Armbruster | | 166/280 |
| 4,788,236 A | 11/1988 | Kopf | | 524/55 |
| 4,797,183 A | 1/1989 | Yamamoto et al. | | 204/16 |
| 4,797,456 A | 1/1989 | Wessling et al. | | 525/531 |
| 4,814,257 A | 3/1989 | Galloway | | 430/278 |
| 4,816,300 A | 3/1989 | Kooijmans et al. | | 427/386 |
| 4,820,621 A | 4/1989 | Tanka et al. | | 430/331 |
| 4,822,722 A | 4/1989 | Lewis et al. | | 430/326 |
| 4,822,767 A | 4/1989 | Okada et al. | | 503/213 |
| 4,833,067 A | 5/1989 | Tanaka et al. | | 430/331 |
| 4,840,979 A | 6/1989 | Van Iperen et al. | | 523/404 |
| 4,855,333 A | 8/1989 | Rudik et al. | | 522/71 |
| 4,857,566 A | 8/1989 | Helbling | | 523/409 |
| 4,880,882 A | 11/1989 | Morita et al. | | 525/446 |
| 4,885,319 A | 12/1989 | Dougherty et al. | | 522/31 |
| 4,885,355 A | 12/1989 | Wessling et al. | | 528/99 |
| 4,917,923 A | 4/1990 | Yoshida et al. | | 428/34.1 |
| 4,920,040 A | 4/1990 | Ono | | 430/363 |
| 4,929,536 A | 5/1990 | Spak et al. | | 430/325 |
| 4,933,379 A | 6/1990 | Scholten et al. | | 523/404 |
| 4,933,421 A | 6/1990 | Morehead | | 528/91 |
| 4,937,275 A | 6/1990 | Kooijmans et al. | | 523/404 |
| 4,946,733 A | 8/1990 | Seeger, Jr. et al. | | 428/209 |
| 4,950,433 A | 8/1990 | Chiu | | 264/13 |
| 4,962,165 A | 10/1990 | Bortnick et al. | | 525/479 |
| 4,968,584 A | 11/1990 | Nagashima et al. | | 430/309 |
| 4,976,813 A | 12/1990 | Salensky et al. | | 156/230 |
| 4,981,882 A | 1/1991 | Smith et al. | | 523/205 |
| 4,985,344 A | 1/1991 | Uchino et al. | | 430/325 |
| 5,006,575 A | 4/1991 | Chan | | 523/458 |
| 5,009,981 A | 4/1991 | Matsubara et al. | | 430/175 |
| 5,019,618 A | 5/1991 | Chiu | | 524/405 |
| 5,024,922 A | 6/1991 | Moss et al. | | 430/330 |
| 5,045,141 A | 9/1991 | Salensky et al. | | 156/240 |
| 5,047,275 A | 9/1991 | Chiu | | 428/106 |
| 5,055,374 A | 10/1991 | Seio et al. | | 430/190 |
| 5,066,684 A | 11/1991 | LeMay | | 521/64 |
| 5,079,326 A | 1/1992 | Suzuki et al. | | 528/53 |
| 5,082,891 A | 1/1992 | Morita et al. | | 524/481 |
| 5,089,542 A | 2/1992 | Nishida et al. | | 523/410 |
| 5,089,547 A | 2/1992 | McCabe et al. | | 524/262 |
| 5,102,856 A | 4/1992 | Doll et al. | | 503/209 |
| 5,106,724 A | 4/1992 | Nogami et al. | | 430/331 |
| 5,110,710 A | 5/1992 | Tomita et al. | | 430/278 |
| 5,114,816 A | 5/1992 | Scheler et al. | | 430/192 |
| 5,116,883 A | 5/1992 | LeMay | | 521/178 |
| 5,128,230 A | 7/1992 | Templeton et al. | | 430/191 |
| 5,138,424 A | 8/1992 | Moss et al. | | 357/52 |
| 5,147,906 A | 9/1992 | Nishida et al. | | 523/410 |
| 5,149,614 A | 9/1992 | Akiyama et al. | | 430/302 |
| 5,158,995 A | 10/1992 | Nishida et al. | | 523/410 |
| 5,166,036 A | 11/1992 | Seio et al. | | 430/313 |
| 5,166,038 A | 11/1992 | Clodgo et al. | | 430/325 |
| 5,171,722 A | 12/1992 | Tereki et al. | | 501/88 |
| 5,180,689 A | 1/1993 | Liu | | 437/228 |
| 5,188,767 A | 2/1993 | Yamazaki | | 252/512 |
| 5,188,924 A | 2/1993 | Ikari et al. | | 430/312 |
| 5,198,474 A | 3/1993 | Kilgour | | 521/112 |
| 5,204,217 A | 4/1993 | Aoai et al. | | 430/270 |
| 5,204,385 A | 4/1993 | Naderhoff | | 523/417 |
| 5,206,349 A | 4/1993 | Iida et al. | | 534/561 |
| 5,207,954 A | 5/1993 | Lewis et al. | | 264/13 |
| 5,215,147 A | 6/1993 | Grego et al. | | 166/270 |
| 5,225,309 A | 7/1993 | Suzuki et al. | | 430/158 |
| 5,236,472 A | 8/1993 | Kirk et al. | | 51/298 |
| 5,236,784 A | 8/1993 | Kobayashi et al. | | 428/408 |
| 5,238,771 A | 8/1993 | Goto et al. | | 430/165 |
| 5,252,375 A | 10/1993 | Turbak et al. | | 428/96 |
| 5,256,522 A | 10/1993 | Spak et al. | | 430/325 |
| 5,260,161 A | 11/1993 | Matsumura et al. | | 430/161 |
| 5,260,357 A | 11/1993 | Sachdeva | | 523/414 |
| 5,262,449 A | 11/1993 | Narayanan et al. | | 522/31 |
| 5,266,611 A | 11/1993 | Teschendorf | | 523/416 |
| 5,269,890 A | 12/1993 | Marchywka | | 204/146 |
| 5,276,126 A | 1/1994 | Rogler | | |
| 5,279,918 A | 1/1994 | Nishi et al. | | 430/190 |
| 5,279,922 A | 1/1994 | Adachi et al. | | 430/270 |
| 5,284,912 A | 2/1994 | Sato et al. | | 525/65 |
| 5,294,511 A | 3/1994 | Aoai et al. | | 430/270 |
| 5,312,654 A | 5/1994 | Arimatsu et al. | | 427/511 |
| 5,316,850 A | 5/1994 | Sargent et al. | | 428/378 |
| 5,320,931 A | 6/1994 | Umehara et al. | | 430/270 |
| 5,321,101 A | 6/1994 | Suzuki et al. | | 525/452 |
| 5,326,665 A | 7/1994 | Osaki et al. | | 430/192 |
| 5,330,883 A | 7/1994 | Garza | | 430/513 |
| 5,336,925 A | 8/1994 | Moss et al. | | 257/643 |
| 5,340,888 A | 8/1994 | Lemon et al. | | 525/501 |
| 5,344,856 A | 9/1994 | Klein | | 523/403 |
| 5,364,731 A | 11/1994 | Shimizu et al. | | 430/143 |
| 5,364,925 A | 11/1994 | Kohno et al. | | 528/104 |
| 5,370,965 A | 12/1994 | Kondo et al. | | 430/176 |
| 5,378,740 A | 1/1995 | Ng | | 523/414 |
| 5,391,465 A | 2/1995 | Feely | | 430/325 |
| 5,393,637 A | 2/1995 | Kanda et al. | | 430/138 |
| 5,395,729 A | 3/1995 | Reardon et al. | | 430/200 |
| 5,401,606 A | 3/1995 | Reardon et al. | | 430/200 |
| 5,403,695 A | 4/1995 | Hayase et al. | | 430/192 |
| 5,405,701 A | 4/1995 | Fujibayashi et al. | | 428/418 |
| 5,405,931 A | 4/1995 | Kohno et al. | | 528/102 |
| 5,413,894 A | 5/1995 | Sizensky et al. | | 430/165 |
| 5,418,271 A | 5/1995 | Burba, III et al. | | 524/436 |
| 5,420,218 A | 5/1995 | Toribuchi et al. | | 526/214 |
| 5,424,167 A | 6/1995 | Uetani et al. | | 430/191 |
| 5,429,904 A | 7/1995 | Nagase et al. | | 430/192 |
| 5,431,777 A | 7/1995 | Austin et al. | | 156/622.1 |
| 5,444,098 A | 8/1995 | Wallaeys et al. | | 521/95 |
| 5,449,584 A | 9/1995 | Banba et al. | | 430/190 |
| 5,464,913 A | 11/1995 | Nishida et al. | | 525/524 |
| 5,474,666 A | 12/1995 | Seio et al. | | 204/180.2 |
| 5,480,603 A | 1/1996 | Lopez et al. | | 264/131 |

| Patent Number | Date | Inventor | Class |
|---|---|---|---|
| 5,492,945 A | 2/1996 | Morita et al. | 523/212 |
| 5,508,328 A | 4/1996 | Olson | 523/445 |
| 5,523,363 A | 6/1996 | Fujibayashi et al. | 525/481 |
| 5,525,681 A | 6/1996 | Barron et al. | 525/403 |
| 5,527,649 A | 6/1996 | Sato et al. | 430/7 |
| 5,527,839 A | 6/1996 | Walker | 523/404 |
| 5,534,356 A | 7/1996 | Mahulikar et al. | 428/615 |
| 5,549,719 A | 8/1996 | Lee et al. | 51/298 |
| 5,556,732 A | 9/1996 | Chow | 430/137 |
| 5,556,735 A | 9/1996 | Ivory et al. | 430/315 |
| 5,565,060 A | 10/1996 | Austin et al. | 156/662.1 |
| 5,580,702 A | 12/1996 | Hayase et al. | 430/326 |
| 5,589,315 A | 12/1996 | Iida et al. | 430/163 |
| 5,591,654 A | 1/1997 | Kishimura | 437/26 |
| 5,593,913 A | 1/1997 | Aoki | 437/53 |
| 5,601,961 A | 2/1997 | Nakayama et al. | 430/192 |
| 5,605,944 A | 2/1997 | Heebner | 523/404 |
| 5,621,019 A | 4/1997 | Nakano et al. | 522/49 |
| 5,624,978 A | 4/1997 | Soltwedel et al. | 523/402 |
| 5,639,579 A | 6/1997 | Hayashi et al. | 430/7 |
| 5,661,101 A | 8/1997 | Washizu et al. | 503/226 |
| 5,665,518 A | 9/1997 | Maeda et al. | 430/270.1 |
| 5,670,571 A | 9/1997 | Gabrielson et al. | 524/604 |
| 5,681,361 A | 10/1997 | Sanders, Jr. | 51/295 |
| 5,688,606 A | 11/1997 | Mahulikar et al. | 428/615 |
| 5,691,098 A | 11/1997 | Busman et al. | 430/158 |
| 5,691,111 A | 11/1997 | Iwasa et al. | 430/270.1 |
| 5,691,401 A | 11/1997 | Morita et al. | 523/435 |
| 5,691,548 A | 11/1997 | Akio | 257/232 |
| 5,693,684 A | 12/1997 | Rader | 521/78 |
| 5,695,907 A | 12/1997 | Chang | 430/201 |
| 5,698,269 A | 12/1997 | Carlblom et al. | 427/475 |
| 5,698,369 A | 12/1997 | Kawamura et al. | 430/281.1 |
| 5,705,308 A | 1/1998 | West et al. | 430/165 |
| 5,705,309 A | 1/1998 | West et al. | 430/167 |
| 5,705,322 A | 1/1998 | West et al. | 430/325 |
| 5,718,992 A | 2/1998 | Sato et al. | 430/7 |
| 5,731,123 A | 3/1998 | Kawamura et al. | 430/176 |
| 5,731,128 A | 3/1998 | Kanda et al. | 430/281.1 |
| 5,736,619 A | 4/1998 | Kane et al. | 525/393 |
| 5,738,975 A | 4/1998 | Nakano et al. | 430/280.1 |
| 5,747,217 A | 5/1998 | Zaklika et al. | 430/158 |
| 5,750,291 A | 5/1998 | Ivory et al. | 430/11 |
| 5,755,910 A | 5/1998 | Masuda et al. | 156/235 |
| 5,756,256 A | 5/1998 | Nakato et al. | 430/272.1 |
| 5,756,689 A | 5/1998 | Busman et al. | 534/560 |
| 5,756,850 A | 5/1998 | Iwasa et al. | 568/75 |
| 5,757,313 A | 5/1998 | Meneghini et al. | 347/262 |
| 5,770,346 A | 6/1998 | Iwasa et al. | 430/270.1 |
| 5,782,300 A | 7/1998 | James et al. | 166/278 |
| 5,789,506 A | 8/1998 | Toribuchi et al. | 526/214 |
| 5,811,221 A | 9/1998 | Miller et al. | 430/302 |
| 5,821,277 A | 10/1998 | Hirayama et al. | 522/50 |
| 5,824,451 A | 10/1998 | Aoai et al. | 430/270.1 |
| 5,830,274 A | 11/1998 | Jones et al. | 118/620 |
| 5,837,374 A | 11/1998 | Hirayama et al. | 428/408 |
| 5,851,735 A | 12/1998 | Miller et al. | 430/322 |
| 5,853,894 A | 12/1998 | Brown | 428/422 |
| 5,853,954 A | 12/1998 | Rahman et al. | 430/270.1 |
| 5,856,382 A | 1/1999 | Ohrbom et al. | 523/414 |
| 5,858,547 A | 1/1999 | Drage | 428/451 |
| 5,858,604 A | 1/1999 | Takeda et al. | 430/162 |
| 5,866,237 A | 2/1999 | Angelopoulos et al. | 428/209 |
| 5,866,304 A | 2/1999 | Nakano et al. | 430/325 |
| 5,871,846 A | 2/1999 | Freeman et al. | 428/405 |
| 5,872,168 A | 2/1999 | Katoot | 524/354 |
| 5,877,240 A | 3/1999 | Piret et al. | 523/415 |
| 5,879,600 A | 3/1999 | Symons | 264/110 |
| 5,883,164 A | 3/1999 | Katoot | 524/104 |
| 5,886,092 A | 3/1999 | Shaw et al. | 524/611 |
| 5,886,102 A | 3/1999 | Sinta et al. | 525/154 |
| 5,888,283 A | 3/1999 | Mehta et al. | 106/31.16 |
| 5,910,358 A | 6/1999 | Thoen et al. | 428/316.6 |
| 5,910,559 A | 6/1999 | Rahman | |
| 5,919,601 A | 7/1999 | Nguyen et al. | 430/278.1 |
| 5,928,836 A * | 7/1999 | Rahman et al. | 430/270.1 |
| 5,935,652 A | 8/1999 | Angelopoulos et al. | 427/316 |
| 5,939,236 A | 8/1999 | Pavelchek et al. | 430/273.1 |
| 5,945,493 A | 8/1999 | Pechhold et al. | 526/243 |
| 5,948,591 A | 9/1999 | Vermeersch et al. | 430/270.1 |
| 5,955,413 A | 9/1999 | Campagna et al. | 510/278 |
| 5,958,655 A | 9/1999 | Miller et al. | 430/331 |
| 5,965,319 A * | 10/1999 | Kobayashi | 430/176 |
| 5,965,320 A | 10/1999 | Torimitsu et al. | 430/192 |
| 5,981,144 A | 11/1999 | Damme et al. | 430/271.1 |
| 5,985,522 A | 11/1999 | Iwasa et al. | 430/315 |
| 5,990,189 A | 11/1999 | Hall et al. | 522/79 |
| 5,993,945 A | 11/1999 | Russell et al. | 428/209 |
| 5,994,025 A | 11/1999 | Iwasa et al. | 430/270.1 |
| 5,997,997 A | 12/1999 | Angelopoulos et al. | 428/209 |
| 6,004,728 A | 12/1999 | Deroover et al. | 430/302 |
| 6,005,026 A | 12/1999 | Piret et al. | 523/206 |
| 6,010,956 A | 1/2000 | Takiguchi et al. | 438/623 |
| 6,013,411 A | 1/2000 | Aoai et al. | 430/270.1 |
| 6,013,699 A | 1/2000 | Freeman et al. | 523/212 |
| 6,016,870 A | 1/2000 | Dewprashad et al. | 166/295 |
| 6,022,670 A | 2/2000 | Russell et al. | 430/315 |
| 6,025,057 A | 2/2000 | Angelopoulos et al. | 428/209 |
| 6,025,059 A | 2/2000 | McGee et al. | 428/219 |
| 6,027,853 A | 2/2000 | Malik et al. | 430/270.1 |
| 6,033,830 A | 3/2000 | Sinta et al. | 430/325 |
| 6,037,968 A | 3/2000 | Emge et al. | 347/260 |
| 6,045,963 A | 4/2000 | Huang et al. | 430/166 |
| 6,048,799 A * | 4/2000 | Prybyla | 438/760 |
| 6,060,207 A | 5/2000 | Shida et al. | 430/176 |
| 6,060,217 A | 5/2000 | Nguyen et al. | 430/302 |
| 6,060,218 A | 5/2000 | Van Damme et al. | 430/302 |
| 6,060,222 A | 5/2000 | West et al. | 430/326 |
| 6,063,544 A | 5/2000 | Sheriff et al. | 430/271.1 |
| 6,066,889 A | 5/2000 | Jones et al. | 257/698 |
| 6,068,963 A | 5/2000 | Aoshima | 430/270.1 |
| 6,083,658 A | 7/2000 | Kunita et al. | 430/270.1 |
| 6,083,662 A | 7/2000 | Miller et al. | 430/302 |
| 6,083,663 A | 7/2000 | Vermeersch et al. | 430/302 |
| 6,090,905 A | 7/2000 | Juzukonis et al. | 528/114 |
| 6,117,610 A | 9/2000 | Sheriff et al. | 430/190 |
| 6,120,716 A | 9/2000 | Kushida et al. | 264/117 |
| 6,136,513 A | 10/2000 | Angelopoulos et al. | 428/315 |
| 6,138,568 A | 10/2000 | McCullough et al. | 101/465 |
| 6,143,464 A | 11/2000 | Kawauchi | 430/270.1 |
| 6,143,472 A | 11/2000 | Sumino et al. | 430/283.1 |
| 6,143,479 A | 11/2000 | Fiebag et al. | 430/331 |
| 6,146,556 A | 11/2000 | Katoot | 252/609 |
| 6,152,036 A | 11/2000 | Verschueren et al. | 101/457 |
| 6,153,353 A | 11/2000 | Van Damme et al. | 430/270.1 |
| 6,156,389 A | 12/2000 | Brown et al. | 427/393.4 |
| 6,160,068 A | 12/2000 | Sumino | 526/209 |
| 6,165,676 A * | 12/2000 | Hattori | 430/270.1 |
| 6,165,689 A | 12/2000 | Vermeersch et al. | 430/302 |
| 6,165,690 A | 12/2000 | Yoshida et al. | 430/302 |
| 6,171,774 B1 | 1/2001 | Hiyama et al. | 430/551 |
| 6,175,087 B1 | 1/2001 | Keesler et al. | 174/261 |
| 6,177,230 B1 | 1/2001 | Kawamura | 430/270.1 |
| 6,180,696 B1 | 1/2001 | Wong et al. | 523/457 |
| 6,187,380 B1 | 2/2001 | Hallman et al. | 427/261 |
| 6,192,799 B1 | 2/2001 | Damme et al. | 101/457 |
| 6,195,264 B1 | 2/2001 | Lauffer et al. | 361/762 |
| 6,197,105 B1 | 3/2001 | Freeman et al. | 106/487 |
| 6,197,378 B1 | 3/2001 | Clark et al. | 427/315 |
| 6,197,473 B1 | 3/2001 | Kihara et al. | 430/192 |
| 6,201,194 B1 | 3/2001 | Lauffer et al. | 174/261 |
| 6,204,453 B1 | 3/2001 | Fallon et al. | 174/255 |
| 6,204,456 B1 | 3/2001 | Lauffer et al. | 174/262 |
| 6,214,923 B1 | 4/2001 | Goto et al. | 524/514 |
| 6,218,075 B1 | 4/2001 | Kimura et al. | 430/276.1 |
| 6,221,989 B1 | 4/2001 | Furihata et al. | 526/261 |
| 6,225,376 B1 | 5/2001 | Klein et al. | 523/404 |
| 6,228,465 B1 | 5/2001 | Takiguchi et al. | 428/209 |
| 6,232,031 B1 | 5/2001 | Gracia et al. | 430/165 |
| 6,234,251 B1 | 5/2001 | Chatterji et al. | 166/295 |
| 6,235,451 B1 | 5/2001 | Damme et al. | 430/302 |
| 6,238,792 B1 | 5/2001 | Pechhold et al. | 428/394 |
| 6,238,843 B1 | 5/2001 | Ray et al. | 430/302 |
| 6,242,151 B1 | 6/2001 | Furihata et al. | 430/190 |
| 6,244,344 B1 | 6/2001 | Chatterji et al. | 166/295 |
| 6,245,116 B1 | 6/2001 | Pechhold et al. | 8/115.64 |
| 6,245,835 B1 | 6/2001 | Klein et al. | 523/402 |
| 6,248,499 B1 | 6/2001 | Maeda et al. | 430/270.1 |

| Patent | Date | Inventor | Class |
|---|---|---|---|
| 6,251,563 B1 | 6/2001 | Van Damme et al. | 430/302 |
| 6,255,042 B1 | 7/2001 | Fiebag et al. | 430/331 |
| 6,258,510 B1 | 7/2001 | Maemoto | 430/278.1 |
| 6,258,514 B1 | 7/2001 | Montgomery | |
| 6,261,740 B1 | 7/2001 | Nguyen et al. | 430/271.1 |
| 6,261,743 B1 | 7/2001 | Pavelchek et al. | 430/325 |
| 6,261,745 B1 | 7/2001 | Tanabe et al. | 430/331 |
| 6,271,181 B1 | 8/2001 | Chatterji et al. | 507/219 |
| 6,274,287 B1 | 8/2001 | Moriuma et al. | 430/270.1 |
| 6,274,291 B1 | 8/2001 | Bhatt et al. | 430/312 |
| 6,280,900 B1 | 8/2001 | Chiba et al. | 430/270.1 |
| 6,284,440 B1 | 9/2001 | Hirano et al. | 430/331 |
| 6,303,078 B1 | 10/2001 | Shimizu et al. | 422/8 |
| 6,316,144 B1 | 11/2001 | Xue et al. | 429/231.4 |
| 6,319,853 B1 | 11/2001 | Ishibashi et al. | 438/780 |
| 6,326,123 B1 | 12/2001 | West et al. | 430/270.1 |
| 6,328,106 B1 | 12/2001 | Griffith et al. | 166/295 |
| 6,330,917 B2 | 12/2001 | Chatterji et al. | 166/295 |
| 6,331,583 B1 | 12/2001 | Walker | 523/404 |
| 6,331,602 B1 | 12/2001 | Sumino | 526/281 |
| 6,340,815 B1 | 1/2002 | Verschueren et al. | 250/318 |
| 6,342,336 B2 | 1/2002 | Verschueren et al. | 430/271.1 |
| 6,342,562 B1 | 1/2002 | Kozawa et al. | 524/588 |
| 6,346,353 B1 | 2/2002 | Wang et al. | 430/14 |
| 6,350,309 B2 | 2/2002 | Chatterji et al. | 106/677 |
| 6,352,811 B1 | 3/2002 | Patel et al. | 430/270.1 |
| 6,355,396 B1 | 3/2002 | Nakamura | 430/281.1 |
| 6,358,660 B1 | 3/2002 | Agler et al. | 430/126 |
| 6,361,923 B1 | 3/2002 | Kresge et al. | 430/280.1 |
| 6,364,544 B1 | 4/2002 | Sasayama et al. | 396/578 |
| 6,376,158 B1 | 4/2002 | Jones et al. | 430/315 |
| 6,376,160 B1 | 4/2002 | Wang et al. | 430/350 |
| 6,383,652 B1 | 5/2002 | Templeton | 428/507 |
| 6,383,714 B1 | 5/2002 | Nakamura | 430/270.1 |
| 6,388,204 B1 | 5/2002 | Lauffer et al. | 174/261 |
| 6,391,517 B1 | 5/2002 | Verschueren et al. | 430/270.1 |
| 6,391,529 B2 | 5/2002 | Maeda et al. | 430/326 |
| 6,391,530 B1 | 5/2002 | Timpe et al. | 430/450 |
| 6,399,270 B1 | 6/2002 | Mori et al. | 430/270.1 |
| 6,401,817 B1 | 6/2002 | Griffith et al. | 166/295 |
| 6,406,789 B1 | 6/2002 | McDaniel et al. | 428/402 |
| 6,407,006 B1 | 6/2002 | Levert et al. | 438/761 |
| 6,413,700 B1 | 7/2002 | Hallman et al. | 430/302 |
| 6,423,458 B2 | 7/2002 | Ohnishi | 430/30 |
| 6,423,462 B1 | 7/2002 | Kunita | 430/156 |
| 6,432,608 B1 | 8/2002 | Fujie et al. | 430/270.1 |
| 6,436,596 B1 | 8/2002 | Aono et al. | 430/30 |
| 6,436,617 B1 | 8/2002 | Wang et al. | 430/350 |
| 6,437,058 B2 | 8/2002 | Furihata et al. | 525/502 |
| 6,440,633 B1 | 8/2002 | Kawauchi | 430/270.1 |
| 6,441,122 B1 | 8/2002 | DeMott et al. | 528/137 |
| 6,444,393 B2 | 9/2002 | Nakamura et al. | 430/270.1 |
| 6,447,914 B1 | 9/2002 | Angelopoulos et al. | 428/414 |
| 6,447,919 B1 | 9/2002 | Brown et al. | 428/422 |
| 6,447,977 B2 | 9/2002 | Vermeersch et al. | 430/270.1 |
| 6,448,206 B1 | 9/2002 | Griffith et al. | 507/219 |
| 6,451,153 B1 | 9/2002 | Symons | 156/276 |
| 6,451,496 B2 | 9/2002 | Ueda et al. | 430/190 |
| 6,451,509 B2 | 9/2002 | Keesler et al. | 430/311 |
| 6,455,229 B1 | 9/2002 | Vermeersch et al. | 430/302 |
| 6,455,476 B1 | 9/2002 | Imai et al. | 508/156 |
| 6,458,510 B1 | 10/2002 | Vermeersch et al. | 430/302 |
| 6,472,119 B1 | 10/2002 | Vermeersch et al. | 430/270.1 |
| 6,476,174 B1 | 11/2002 | Lee et al. | 528/29 |
| 6,476,240 B2 | 11/2002 | Sumino | 549/369 |
| 6,479,093 B2 | 11/2002 | Lauffer et al. | 427/96 |
| 6,479,216 B1 | 11/2002 | Vermeersch et al. | 430/302 |
| 6,489,079 B1 | 12/2002 | Vermeersch et al. | 430/270.1 |
| 6,492,089 B2 | 12/2002 | Hatakeyama et al. | 430/270.1 |
| 6,492,432 B1 | 12/2002 | Rader | 521/135 |
| 6,495,624 B1 | 12/2002 | Brown | 524/462 |
| 6,503,694 B1 | 1/2003 | Li et al. | 430/331 |
| 6,503,870 B2 | 1/2003 | Griffith et al. | 507/219 |
| 6,506,441 B2 | 1/2003 | Hacker et al. | 427/96 |
| 6,506,533 B1 | 1/2003 | Kottmair et al. | 430/190 |
| 6,506,831 B2 | 1/2003 | Hacker et al. | 524/509 |
| 6,511,782 B1 | 1/2003 | Vermeersch et al. | 430/270.1 |
| 6,511,790 B2 | 1/2003 | Takamiya | 430/302 |
| 6,517,951 B2 | 2/2003 | Hacker et al. | 428/524 |
| 6,519,843 B2 | 2/2003 | Lauffer et al. | 29/840 |
| 6,524,777 B1 | 2/2003 | Whitesides et al. | 430/371 |
| 6,525,115 B2 | 2/2003 | Wang et al. | 523/466 |
| 6,528,157 B1 | 3/2003 | Hussain et al. | 428/325 |
| 6,528,218 B1 | 3/2003 | Foster et al. | 430/14 |
| 6,534,459 B1 | 3/2003 | Yata et al. | 510/176 |
| 6,537,725 B2 | 3/2003 | Kunita et al. | 430/270.1 |
| 6,541,077 B1 | 4/2003 | Kozawa et al. | 427/503 |
| 6,548,155 B1 | 4/2003 | Jaffee | 428/297.4 |
| 6,548,166 B2 | 4/2003 | Figuly et al. | 428/370 |
| 6,555,507 B2 | 4/2003 | Chatterji et al. | 507/219 |
| 6,558,867 B2 | 5/2003 | Noda et al. | 430/191 |
| 6,559,337 B2 | 5/2003 | Maeda et al. | 560/205 |
| 6,562,550 B2 | 5/2003 | Takahata et al. | 430/320 |
| 6,569,594 B2 | 5/2003 | Damme et al. | 430/270.1 |
| 6,569,609 B2 | 5/2003 | Timpe et al. | 430/399 |
| 6,579,657 B1 | 6/2003 | Ishibashi et al. | 430/270.1 |
| 6,582,819 B2 | 6/2003 | McDaniel et al. | 428/402 |
| 6,586,483 B2 | 7/2003 | Kolb et al. | 521/91 |
| 6,590,010 B2 | 7/2003 | Kato et al. | 522/148 |
| 6,593,055 B2 | 7/2003 | Shimazu et al. | 430/166 |
| 6,593,402 B2 | 7/2003 | Chatterji et al. | 524/7 |
| 6,596,455 B2 | 7/2003 | Yanaka et al. | 430/138 |
| 6,599,676 B2 | 7/2003 | Savariar-Hauck et al. | 430/270.1 |
| 6,605,409 B2 | 8/2003 | Kodama et al. | 430/270.1 |
| 6,608,162 B1 | 8/2003 | Chiu et al. | 528/129 |
| 6,610,754 B1 | 8/2003 | Rader | 521/78 |
| 6,613,494 B2 | 9/2003 | Savariar-Hauck et al. | 430/272.1 |
| 6,613,862 B2 | 9/2003 | Clark et al. | 528/49 |
| 6,623,817 B1 | 9/2003 | Yang et al. | 428/32.12 |
| 6,624,216 B2 | 9/2003 | Morganelli et al. | 523/435 |
| 6,627,691 B2 | 9/2003 | Mowrey et al. | 524/492 |
| 6,630,274 B1 | 10/2003 | Kiguchi et al. | 430/7 |
| 6,632,511 B2 | 10/2003 | Zhang | 428/209 |
| 6,632,527 B1 | 10/2003 | McDaniel et al. | 428/402 |
| 6,635,400 B2 | 10/2003 | Kato et al. | 430/170 |
| 6,638,853 B1 | 10/2003 | Sue et al. | 438/633 |
| 6,649,324 B1 | 11/2003 | Fiebag et al. | 430/302 |
| 6,656,661 B2 | 12/2003 | Hong et al. | 430/272.1 |
| 6,660,362 B1 | 12/2003 | Lindsay et al. | 428/131 |
| 6,660,454 B2 | 12/2003 | Fiebag | 430/292 |
| 6,663,941 B2 | 12/2003 | Brown et al. | 428/141 |
| 6,667,137 B2 | 12/2003 | Kottmair et al. | 430/18 |
| 6,670,099 B2 | 12/2003 | Sawada et al. | 430/278.1 |
| 6,670,747 B2 | 12/2003 | Ito et al. | 313/497 |
| 6,673,514 B2 | 1/2004 | Kitson et al. | 430/270.1 |
| 6,677,106 B2 | 1/2004 | Blum et al. | 430/302 |
| 6,677,113 B2 | 1/2004 | Kagawa et al. | 430/570 |
| 6,680,440 B1 | 1/2004 | Russell et al. | 174/260 |
| 6,689,543 B2 | 2/2004 | Kresge et al. | 430/320 |
| 6,691,618 B2 | 2/2004 | Deutsch et al. | 101/465 |
| 6,699,636 B2 | 3/2004 | Savariar-Hauck | 430/270.1 |
| 6,703,324 B2 | 3/2004 | Wong | 438/787 |
| 6,706,464 B2 | 3/2004 | Foster et al. | 430/315 |
| 6,716,565 B2 | 4/2004 | Kunita et al. | 430/270.1 |
| 6,716,567 B2 | 4/2004 | Endo et al. | 430/278.1 |
| 6,716,573 B2 | 4/2004 | Fujie et al. | 430/326 |
| 6,723,483 B1 | 4/2004 | Oono et al. | 430/170 |
| 6,723,490 B2 | 4/2004 | Patel et al. | 430/271.1 |
| 6,723,780 B2 * | 4/2004 | Hacker et al. | 524/509 |
| 6,727,031 B2 | 4/2004 | Shimada et al. | 430/138 |
| 6,727,293 B2 | 4/2004 | Rader | 521/78 |
| 6,729,404 B2 | 5/2004 | Nguyen et al. | 166/280.2 |
| 6,730,256 B1 | 5/2004 | Bloomstein et al. | 264/401 |
| 6,733,901 B2 | 5/2004 | Takasaki et al. | 428/620 |
| 6,733,952 B2 | 5/2004 | Kaneko et al. | 430/270.1 |
| 6,737,158 B1 | 5/2004 | Thompson | 428/306.6 |
| 6,737,225 B2 | 5/2004 | Miller | 430/329 |
| 6,739,260 B2 | 5/2004 | Damme et al. | 101/465 |
| 6,740,464 B2 | 5/2004 | Maemoto | 430/138 |
| 6,746,896 B1 | 6/2004 | Shi et al. | 438/108 |
| 6,750,405 B1 | 6/2004 | Fallon et al. | 174/262 |
| 6,759,185 B2 | 7/2004 | Fiebag et al. | 430/399 |
| 6,764,552 B1 | 7/2004 | Joyce et al. | 134/3 |
| 6,764,587 B2 | 7/2004 | Sawada et al. | 205/214 |
| 6,767,587 B1 | 7/2004 | Brown | 427/393.4 |
| 6,773,639 B2 | 8/2004 | Moyes et al. | 264/40.6 |
| 6,773,809 B1 | 8/2004 | Itoh et al. | 428/355 |
| 6,773,858 B2 | 8/2004 | Kato et al. | 430/190 |

| Patent No. | Date | Inventor(s) | Class |
|---|---|---|---|
| 6,777,102 B2 | 8/2004 | Sakurai et al. | 428/521 |
| 6,777,170 B1 | 8/2004 | Bloomstein et al. | 430/320 |
| 6,788,452 B2 | 9/2004 | Liang et al. | 359/296 |
| 6,790,568 B2 | 9/2004 | Goto | 430/7 |
| 6,790,581 B2 | 9/2004 | Kato et al. | 430/190 |
| 6,790,590 B2 | 9/2004 | Collins et al. | 430/270.1 |
| 6,791,839 B2 | 9/2004 | Bhagwagar | 361/705 |
| 6,800,426 B2 | 10/2004 | Ray et al. | 430/322 |
| 6,803,167 B2 | 10/2004 | Patel et al. | 430/166 |
| 6,803,170 B2 | 10/2004 | Toriumi et al. | 430/270.1 |
| 6,806,021 B2 | 10/2004 | Sato et al. | 430/198 |
| 6,806,031 B2 | 10/2004 | Endo et al. | 430/278.1 |
| 6,808,857 B2 * | 10/2004 | Miyamoto et al. | 430/157 |
| 6,809,269 B2 | 10/2004 | Fuller, Jr. et al. | 174/264 |
| 6,815,137 B2 | 11/2004 | Hoshi et al. | 430/138 |
| 6,815,140 B2 | 11/2004 | Uetani et al. | 430/165 |
| 6,821,705 B2 | 11/2004 | Nagai et al. | 430/270.1 |
| 6,824,927 B1 | 11/2004 | Katsurao et al. | 430/157 |
| 6,830,862 B2 | 12/2004 | Kitson et al. | 430/156 |
| 6,830,868 B2 | 12/2004 | Nagai et al. | 430/270.1 |
| 6,830,872 B2 | 12/2004 | Mizutani et al. | 430/276.1 |
| 6,833,234 B1 | 12/2004 | Bloomstein et al. | 430/321 |
| 6,835,533 B2 | 12/2004 | Foster et al. | 430/280.1 |
| 2001/0000515 A1 | 4/2001 | Hacker et al. | 524/462 |
| 2001/0001699 A1 | 5/2001 | Vermeersch et al. | 430/270.1 |
| 2001/0001700 A1 | 5/2001 | Verschueren et al. | 430/271.1 |
| 2001/0001701 A1 | 5/2001 | Damme et al. | 430/271.1 |
| 2001/0003639 A1 | 6/2001 | Nakamura et al. | 430/270.1 |
| 2001/0003772 A1 | 6/2001 | Hatakeyama et al. | 526/279 |
| 2001/0004936 A1 | 6/2001 | Chatterji et al. | 166/295 |
| 2001/0005530 A1 | 6/2001 | Clark et al. | 427/393.4 |
| 2001/0009129 A1 | 7/2001 | Kunita et al. | 101/453 |
| 2001/0009133 A1 | 7/2001 | Chatterji et al. | 106/724 |
| 2001/0017643 A1 | 8/2001 | Uto et al. | 347/106 |
| 2001/0018159 A1 | 8/2001 | Maemoto | 430/138 |
| 2001/0018497 A1 | 8/2001 | Furihata et al. | 525/502 |
| 2001/0018799 A1 | 9/2001 | Lauffer et al. | 29/846 |
| 2001/0019808 A1 | 9/2001 | Noda et al. | 430/191 |
| 2001/0023044 A1 | 9/2001 | Keesler et al. | 430/22 |
| 2001/0026900 A1 | 10/2001 | Shimada et al. | 430/138 |
| 2001/0026905 A1 | 10/2001 | Uetani et al. | 430/311 |
| 2001/0031429 A1 | 10/2001 | Maeda et al. | 430/326 |
| 2001/0032723 A1 | 10/2001 | Chatterji et al. | 166/295 |
| 2001/0037742 A1 | 11/2001 | Ohnishi | 101/451 |
| 2001/0038965 A1 | 11/2001 | Ueda et al. | 430/190 |
| 2001/0041308 A1 | 11/2001 | Bhatt et al. | 430/312 |
| 2001/0044066 A1 | 11/2001 | Kato et al. | 430/191 |
| 2001/0044078 A1 | 11/2001 | Takahata et al. | 430/320 |
| 2001/0046638 A1 | 11/2001 | Yanaka et al. | 430/138 |
| 2002/0002265 A1 | 1/2002 | Hacker et al. | 528/154 |
| 2002/0006574 A1 | 1/2002 | Uetani et al. | 430/191 |
| 2002/0006578 A1 | 1/2002 | Kodama et al. | 430/270.1 |
| 2002/0008381 A1 | 1/2002 | Hare | 283/72 |
| 2002/0012809 A1 | 1/2002 | Hacker et al. | 428/524 |
| 2002/0012875 A1 | 1/2002 | Pavelchek et al. | 430/270.1 |
| 2002/0020529 A1 | 2/2002 | Griffith et al. | 166/276 |
| 2002/0020530 A1 | 2/2002 | Griffith et al. | 166/276 |
| 2002/0022193 A1 | 2/2002 | Toriumi et al. | 430/170 |
| 2002/0022579 A1 | 2/2002 | Griffith et al. | 507/220 |
| 2002/0030438 A1 | 3/2002 | Ito et al. | 313/495 |
| 2002/0033263 A1 | 3/2002 | Chatterji et al. | 166/292 |
| 2002/0039702 A1 | 4/2002 | Hotta | 430/129.1 |
| 2002/0040122 A1 | 4/2002 | Mirasol et al. | 528/77 |
| 2002/0042531 A1 | 4/2002 | Sumino | 556/437 |
| 2002/0048676 A1 | 4/2002 | McDaniel et al. | 428/404 |
| 2002/0048714 A1 | 4/2002 | Sawada et al. | 430/147 |
| 2002/0051931 A1 | 5/2002 | Mori et al. | 430/270.1 |
| 2002/0055066 A1 | 5/2002 | Takamiya | 430/331 |
| 2002/0055550 A1 | 5/2002 | Kato et al. | 522/134 |
| 2002/0056648 A1 | 5/2002 | Sawada et al. | 205/219 |
| 2002/0058201 A1 | 5/2002 | Miyaji et al. | 430/270.1 |
| 2002/0061453 A1 | 5/2002 | Sato et al. | 430/5 |
| 2002/0064958 A1 | 5/2002 | Takeuchi | 438/695 |
| 2002/0086226 A1 | 7/2002 | Maehara | 430/18 |
| 2002/0094490 A1 | 7/2002 | Endo et al. | 430/278.1 |
| 2002/0094491 A1 | 7/2002 | Kresge et al. | 430/280.1 |
| 2002/0098331 A1 | 7/2002 | Lauffer et al. | 428/209 |
| 2002/0100164 A1 | 8/2002 | Tanaka et al. | 29/832 |
| 2002/0100996 A1 | 8/2002 | Moyes et al. | 264/122 |
| 2002/0104455 A1 | 8/2002 | Deutsch et al. | 101/463.1 |
| 2002/0106509 A1 | 8/2002 | Figuly et al. | 428/364 |
| 2002/0106593 A1 | 8/2002 | Kagawa et al. | 430/574 |
| 2002/0107306 A1 | 8/2002 | Wang et al. | 523/412 |
| 2002/0111509 A1 | 8/2002 | Maeda et al. | 560/205 |
| 2002/0115285 A1 | 8/2002 | Wong | 438/638 |
| 2002/0120058 A1 | 8/2002 | Kozawa et al. | 524/588 |
| 2002/0128336 A1 | 9/2002 | Kolb et al. | 521/50 |
| 2002/0134266 A1 | 9/2002 | Yamasaki et al. | 101/453 |
| 2002/0136979 A1 | 9/2002 | Miyake et al. | 430/156 |
| 2002/0146634 A1 | 10/2002 | Hong et al. | 430/166 |
| 2002/0156148 A1 | 10/2002 | Arase et al. | 523/1 |
| 2002/0168581 A1 | 11/2002 | Takeda et al. | 430/270.1 |
| 2002/0168584 A1 | 11/2002 | Aoai et al. | 430/270.1 |
| 2002/0182529 A1 | 12/2002 | Hoshi et al. | 430/138 |
| 2002/0187425 A1 | 12/2002 | Savariar-Hauck et al. | 430/272.1 |
| 2002/0187427 A1 | 12/2002 | Fiebag | 430/292 |
| 2002/0188033 A1 | 12/2002 | Maeda | 522/31 |
| 2002/0192593 A1 | 12/2002 | Nagai et al. | 430/270.1 |
| 2003/0004221 A1 | 1/2003 | Sakurai et al. | 522/15 |
| 2003/0005838 A1 | 1/2003 | Damme et al. | 101/465 |
| 2003/0008116 A1 | 1/2003 | Williams et al. | 428/195 |
| 2003/0010748 A1 | 1/2003 | Kodama et al. | 216/41 |
| 2003/0011738 A1 | 1/2003 | Akiyama et al. | 349/156 |
| 2003/0017349 A1 | 1/2003 | Brown et al. | 428/451 |
| 2003/0018117 A1 | 1/2003 | Mowrey et al. | 524/492 |
| 2003/0026910 A1 | 2/2003 | Wait | 427/402 |
| 2003/0027899 A1 | 2/2003 | Takasaki et al. | 523/400 |
| 2003/0030766 A1 | 2/2003 | Kiguchi et al. | 349/106 |
| 2003/0031860 A1 | 2/2003 | Hotta et al. | 430/270.1 |
| 2003/0039920 A1 | 2/2003 | Fujie et al. | 430/270.1 |
| 2003/0044714 A1 | 3/2003 | Teraoka et al. | 430/138 |
| 2003/0044738 A1 | 3/2003 | Takeyama | 430/620 |
| 2003/0044947 A1 | 3/2003 | Kasahara et al. | 436/149 |
| 2003/0049377 A1 | 3/2003 | Chesnut et al. | 427/299 |
| 2003/0057610 A1 | 3/2003 | Kunita et al. | 264/401 |
| 2003/0064323 A1 | 4/2003 | Sato et al. | 430/313 |
| 2003/0068556 A1 | 4/2003 | Xue et al. | 429/231.8 |
| 2003/0073012 A1 | 4/2003 | Fiebag | 430/18 |
| 2003/0073040 A1 | 4/2003 | Iwasawa et al. | 430/312 |
| 2003/0077538 A1 | 4/2003 | Kitson et al. | 430/270.1 |
| 2003/0082489 A1 | 5/2003 | Timpe et al. | 430/399 |
| 2003/0084807 A1 | 5/2003 | Kawauchi et al. | 101/458 |
| 2003/0089669 A1 | 5/2003 | Fiebag et al. | 210/732 |
| 2003/0091800 A1 | 5/2003 | Zhang | 428/209 |
| 2003/0091932 A1 | 5/2003 | Loccufier et al. | 430/272.1 |
| 2003/0096191 A1 | 5/2003 | Kato et al. | 430/270.1 |
| 2003/0096199 A1 | 5/2003 | Nakagawa et al. | 430/325 |
| 2003/0099909 A1 | 5/2003 | Takamiya | 430/331 |
| 2003/0104307 A1 | 6/2003 | Shimazu et al. | 430/166 |
| 2003/0107158 A1 | 6/2003 | Levy | 264/494 |
| 2003/0108746 A1 | 6/2003 | Laminate Systems Corp et al. | 428/413 |
| 2003/0108817 A1 | 6/2003 | Patel et al. | 430/285.1 |
| 2003/0113526 A1 | 6/2003 | Jaffee | 428/297.4 |
| 2003/0113654 A1 | 6/2003 | Savariar-Hauck | 430/165 |
| 2003/0113658 A1 | 6/2003 | Ebata et al. | 430/270.1 |
| 2003/0118949 A1 | 6/2003 | Ray et al. | 430/312 |
| 2003/0121844 A1 | 7/2003 | Koo et al. | 210/490 |
| 2003/0124454 A1 | 7/2003 | Savariar-Hauck et al. | 430/270.1 |
| 2003/0124462 A1 | 7/2003 | Miller | 430/311 |
| 2003/0129532 A1 | 7/2003 | Kawauchi et al. | 430/271.1 |
| 2003/0129536 A1 | 7/2003 | Foster et al. | 430/280.1 |
| 2003/0130409 A1 | 7/2003 | Kaneko et al. | 524/544 |
| 2003/0130482 A1 | 7/2003 | Hacker et al. | 528/501 |
| 2003/0131999 A1 | 7/2003 | Nguyen et al. | 166/280 |
| 2003/0134224 A1 | 7/2003 | Mizutani et al. | 430/270.1 |
| 2003/0143473 A1 | 7/2003 | Goto | 430/7 |
| 2003/0143481 A1 | 7/2003 | Iwato et al. | 430/270.1 |
| 2003/0143499 A1 | 7/2003 | Kagawa et al. | 430/574 |
| 2003/0145748 A1 | 8/2003 | Endo et al. | 101/458 |
| 2003/0146416 A1 | 8/2003 | Takei et al. | 252/500 |
| 2003/0146521 A1 | 8/2003 | Tanaka et al. | 257/783 |
| 2003/0148207 A1 | 8/2003 | Maemoto et al. | 430/138 |
| 2003/0148213 A1 | 8/2003 | Kaneko et al. | 430/270.1 |
| 2003/0148214 A1 | 8/2003 | Fujiwara et al. | 430/270.1 |
| 2003/0149135 A1 | 8/2003 | Morganelli et al. | 523/425 |
| 2003/0151032 A1 | 8/2003 | Ito et al. | 252/570 |
| 2003/0157423 A1 | 8/2003 | Nagai et al. | 430/170 |

| | | | |
|---|---|---|---|
| 2003/0157429 A1 | 8/2003 | Blum et al. ............... 430/270.1 |
| 2003/0157801 A1 | 8/2003 | Kozawa et al. ............... 438/689 |
| 2003/0158286 A1 | 8/2003 | Nishizaki et al. ............ 522/168 |
| 2003/0162126 A1 | 8/2003 | Kitson et al. ............... 430/271.1 |
| 2003/0162911 A1 | 8/2003 | Xiao et al. .................... 525/533 |
| 2003/0164555 A1 | 9/2003 | Tong et al. ................... 257/787 |
| 2003/0165768 A1 | 9/2003 | Hotta et al. .................. 430/146 |
| 2003/0165774 A1* | 9/2003 | Arias et al. ................ 430/271.1 |
| 2003/0165775 A1 | 9/2003 | Endo et al. ................. 430/278.1 |
| 2003/0165779 A1 | 9/2003 | Kottmair et al. .............. 430/302 |
| 2003/0168007 A1 | 9/2003 | Sanada et al. ................. 118/320 |
| 2003/0170559 A1 | 9/2003 | Mizutani et al. ............ 430/270.1 |
| 2003/0170566 A1 | 9/2003 | Yamasaki et al. ........... 430/272.1 |
| 2003/0171456 A1 | 9/2003 | Tong et al. .................... 523/404 |
| 2003/0174385 A1 | 9/2003 | Liang et al. .................... 359/296 |
| 2003/0175619 A1 | 9/2003 | Iihara et al. ................. 430/273.1 |
| 2003/0180597 A1 | 9/2003 | Sakamoto et al. ............ 429/34 |
| 2003/0186170 A1 | 10/2003 | Yamashita .................... 430/311 |
| 2003/0190548 A1 | 10/2003 | Furukawa et al. ......... 430/270.1 |
| 2003/0190549 A1 | 10/2003 | Goto ........................... 430/270.1 |
| 2003/0194634 A1 | 10/2003 | Nagai et al. .................. 430/170 |
| 2003/0194653 A1 | 10/2003 | Takamiya ...................... 430/302 |
| 2003/0196685 A1 | 10/2003 | Anzures et al. ............. 134/22.19 |
| 2003/0199406 A1 | 10/2003 | Anzures et al. ............. 510/175 |
| 2003/0203309 A1 | 10/2003 | Nishimura et al. ......... 430/270.1 |
| 2003/0207209 A1* | 11/2003 | Patil et al. .................. 430/280.1 |
| 2003/0211429 A1 | 11/2003 | Fiebag et al. ................. 430/398 |
| 2003/0211734 A1 | 11/2003 | Maeda et al. ................. 438/676 |
| 2003/0212162 A1 | 11/2003 | Uesugi et al. .................... 522/31 |
| 2003/0215754 A1 | 11/2003 | Lundy et al. ................... 430/325 |
| 2003/0215755 A1 | 11/2003 | Lundy et al. ................... 430/331 |
| 2003/0216487 A1 | 11/2003 | Rader ............................. 521/50 |
| 2003/0216505 A1 | 11/2003 | Akiba et al. ................... 524/588 |
| 2003/0219656 A1 | 11/2003 | Baughman et al. ............. 430/11 |
| 2003/0219676 A1 | 11/2003 | Barclay et al. .............. 430/270.1 |
| 2003/0219679 A1 | 11/2003 | Sasaki et al. ................ 430/270.1 |
| 2003/0221572 A1 | 12/2003 | Matsuura et al. .......... 101/463.1 |
| 2003/0224165 A1 | 12/2003 | Anderson et al. .............. 428/403 |
| 2003/0224281 A1 | 12/2003 | Ishizuka et al. ................ 430/157 |
| 2003/0224286 A1 | 12/2003 | Barclay et al. .............. 430/270.1 |
| 2003/0224288 A1 | 12/2003 | Kodama .................... 430/270.1 |
| 2003/0224291 A1 | 12/2003 | Hatakeyama et al. ..... 430/270.1 |
| 2003/0232259 A1 | 12/2003 | Araki ............................. 430/7 |
| 2003/0234074 A1 | 12/2003 | Bhagwagar ................ 156/325 |
| 2003/0235781 A1 | 12/2003 | Shida et al. ................ 430/270.1 |
| 2004/0001961 A1 | 1/2004 | Ono et al. ..................... 428/500 |
| 2004/0002019 A1 | 1/2004 | Nagase ......................... 430/302 |
| 2004/0005512 A1 | 1/2004 | Mizutani et al. ............ 430/270.1 |
| 2004/0006191 A1 | 1/2004 | Takeda et al. ................... 528/25 |
| 2004/0009426 A1 | 1/2004 | Goto et al. .................. 430/270.1 |
| 2004/0011736 A1 | 1/2004 | Ishikawa et al. .............. 210/614 |
| 2004/0013968 A1 | 1/2004 | Teng ........................... 430/270.1 |
| 2004/0013980 A1 | 1/2004 | Hatakeyama et al. ......... 430/311 |
| 2004/0018443 A1 | 1/2004 | Aoshima .................... 430/270.1 |
| 2004/0018444 A1 | 1/2004 | Nakamura et al. .......... 430/270.1 |
| 2004/0018453 A1 | 1/2004 | Anzures et al. ............... 430/401 |
| 2004/0023154 A1 | 2/2004 | West et al. .................. 430/271.1 |
| 2004/0023155 A1 | 2/2004 | Hayakawa et al. ......... 430/271.1 |
| 2004/0029032 A1 | 2/2004 | Kato et al. ..................... 430/190 |
| 2004/0029395 A1 | 2/2004 | Zhang et al. ................... 438/748 |
| 2004/0029396 A1 | 2/2004 | Zhang et al. ................... 438/748 |
| 2004/0033434 A1 | 2/2004 | Ishihara et al. ............. 430/270.1 |
| 2004/0038138 A1 | 2/2004 | Kiguchi et al. ................... 430/7 |
| 2004/0038147 A1 | 2/2004 | Ray ............................. 430/270.1 |
| 2004/0040713 A1 | 3/2004 | Nguyen et al. ................ 166/295 |
| 2004/0053156 A1 | 3/2004 | Fujita et al. ................... 430/191 |
| 2004/0053800 A1 | 3/2004 | Zhang et al. ................... 510/175 |
| 2004/0058273 A1 | 3/2004 | Sasaki et al. ............... 430/270.1 |
| 2004/0062939 A1 | 4/2004 | Shimada et al. ............. 428/474.4 |
| 2004/0063882 A1 | 4/2004 | Kamon et al. ................. 526/266 |
| 2004/0067432 A1 | 4/2004 | Kitson et al. .................. 430/160 |
| 2004/0067434 A1 | 4/2004 | Kano et al. ................. 430/270.1 |
| 2004/0067435 A1 | 4/2004 | Iwato et al. ................ 430/270.1 |
| 2004/0072420 A1 | 4/2004 | Enomoto et al. ............. 438/636 |
| 2004/0079252 A1 | 4/2004 | Sawada et al. ................ 101/453 |
| 2004/0082699 A1 | 4/2004 | Brown ......................... 524/462 |
| 2004/0084304 A1 | 5/2004 | Thompson .................... 204/296 |
| 2004/0087681 A1 | 5/2004 | Shah ............................. 523/201 |
| 2004/0106060 A1 | 6/2004 | Maemoto ..................... 430/138 |
| 2004/0109853 A1 | 6/2004 | McDaniel .................... 424/94.6 |
| 2004/0110077 A1 | 6/2004 | Yachi et al. ................ 430/108.6 |
| 2004/0110090 A1 | 6/2004 | Patel et al. .................... 430/302 |
| 2004/0118596 A1 | 6/2004 | Fuller, Jr. et al. ............. 174/255 |
| 2004/0118598 A1 | 6/2004 | Fuller, Jr. et al. ............. 174/255 |
| 2004/0127599 A1 | 7/2004 | Abadie et al. ................. 523/136 |
| 2004/0131789 A1 | 7/2004 | Brown ......................... 427/393.4 |
| 2004/0134365 A1 | 7/2004 | Mori .............................. 101/459 |
| 2004/0134682 A1 | 7/2004 | En et al. ........................ 174/258 |
| 2004/0134685 A1 | 7/2004 | Fallon et al. ................... 174/262 |
| 2004/0142276 A1 | 7/2004 | Arai et al. .................. 430/270.1 |
| 2004/0142826 A1 | 7/2004 | Nguyen et al. ................ 507/200 |
| 2004/0144277 A1 | 7/2004 | Collins et al. ................. 101/467 |
| 2004/0146328 A1 | 7/2004 | Sasayama ................... 400/118.2 |
| 2004/0146799 A1 | 7/2004 | Miyamoto et al. ........... 430/138 |
| 2004/0152010 A1 | 8/2004 | Kitson et al. ............... 430/270.1 |
| 2004/0152012 A1 | 8/2004 | Iwato ........................ 430/270.1 |
| 2004/0152018 A1 | 8/2004 | Arias et al. ................ 430/270.1 |
| 2004/0152323 A1 | 8/2004 | Suzuki et al. .................. 438/689 |
| 2004/0154489 A1 | 8/2004 | Deutsch et al. ............ 101/463.1 |
| 2004/0157436 A1 | 8/2004 | Wong ............................ 438/672 |
| 2004/0157735 A1 | 8/2004 | Hare .............................. 503/201 |
| 2004/0158008 A1 | 8/2004 | He et al. .......................... 526/72 |
| 2004/0161702 A1 | 8/2004 | Foster et al. ................ 430/280.1 |
| 2004/0163964 A1 | 8/2004 | Egitto et al. ................... 205/125 |
| 2004/0165882 A1 | 8/2004 | Sasayama ..................... 396/578 |
| 2004/0169913 A1 | 9/2004 | Chen et al. .................... 359/296 |
| 2004/0170930 A1 | 9/2004 | Kawaguchi et al. ........... 430/322 |
| 2004/0175407 A1 | 9/2004 | McDaniel ..................... 424/423 |
| 2004/0175643 A1 | 9/2004 | Baba et al. .................. 430/109.4 |
| 2004/0177998 A1 | 9/2004 | Fuller, Jr. et al. ............. 174/262 |
| 2004/0180285 A1 | 9/2004 | Tao et al. .................... 430/270.1 |
| 2004/0180291 A1 | 9/2004 | Collins et al. ................. 430/302 |
| 2004/0185369 A1 | 9/2004 | Patel .......................... 430/270.1 |
| 2004/0185371 A1 | 9/2004 | Takamiya ................... 430/270.1 |
| 2004/0185374 A1 | 9/2004 | Takamiya ................... 430/270.1 |
| 2004/0192876 A1 | 9/2004 | Hacker et al. ................. 528/129 |
| 2004/0194961 A1 | 10/2004 | Nguyen et al. ................ 166/295 |
| 2004/0197697 A1 | 10/2004 | Korionoff et al. .......... 430/270.1 |
| 2004/0204328 A1 | 10/2004 | Zhang et al. ................... 510/175 |
| 2004/0214108 A1 | 10/2004 | Ray et al. ................... 430/273.1 |
| 2004/0214923 A1 | 10/2004 | Hori et al. ..................... 523/336 |
| 2004/0218889 A1 | 11/2004 | Shelnut et al. ................. 385/143 |
| 2004/0219451 A1 | 11/2004 | Arao et al. .................. 430/270.1 |
| 2004/0224253 A1 | 11/2004 | Arao et al. .................. 430/270.1 |
| 2004/0224258 A1 | 11/2004 | Maemoto et al. ........... 430/270.1 |
| 2004/0231847 A1 | 11/2004 | Nguyen et al. ................ 166/295 |
| 2004/0232330 A1 | 11/2004 | Uenishi et al. ................. 250/306 |
| 2004/0234689 A1 | 11/2004 | Morganelli et al. ........... 427/256 |
| 2004/0234883 A1 | 11/2004 | Maemoto ..................... 430/138 |
| 2004/0235996 A1 | 11/2004 | Shah et al. ..................... 524/366 |
| 2004/0241270 A1 | 12/2004 | Moyes et al. .................. 425/360 |
| 2004/0247880 A1 | 12/2004 | Valette et al. .................. 428/413 |
| 2004/0248031 A1 | 12/2004 | Ansai et al. ................ 430/270.1 |
| 2004/0251446 A1 | 12/2004 | Mantanis et al. ............. 252/8.05 |
| 2004/0253538 A1 | 12/2004 | Fujimori .................... 430/270.1 |
| 2004/0254282 A1 | 12/2004 | Suzuki et al. .................. 524/430 |
| 2004/0258912 A1 | 12/2004 | Piret et al. ..................... 428/375 |
| 2004/0259083 A1 | 12/2004 | Oshima ........................... 435/6 |
| 2004/0259456 A1 | 12/2004 | Ito et al. .......................... 445/50 |
| 2004/0265500 A1 | 12/2004 | Kucera et al. ............... 427/443.1 |
| 2007/0105384 A1* | 5/2007 | McCutcheon et al. ........ 438/692 |

* cited by examiner

Table 1

| Material | $M_n$ | $M_w$ | $M_p$ | $M_z$ | PDI |
|---|---|---|---|---|---|
| Accuflo 2025 | 870 | 1523 | 1256 | 2416 | 1.75 |
| Accuflo 2027 | 862 | 1473 | 1218 | 2385 | 1.71 |

| Step | Time (s) | Speed (rpm) | Acc (rpm/s) | Dsp | Arm1 | Arm2 | Exh flow |
|---|---|---|---|---|---|---|---|
| 1 | 1.0 | 0 | 10000 | | H, NW | H, NW | 200 |
| 2 | 0.5 | 0 | 10000 | | H, NW | H, NW | 200 |
| 3 | 0.5 | 0 | 10000 | 16 | DD, W | H, NW | 200 |
| 4 | 0.5 | 0 | 10000 | | DD, NW | H, NW | 200 |
| 5 | 0.5 | 0 | 10000 | | DD, NW | H, NW | 200 |
| 6 | 0.5 | 0 | 10000 | | DD, NW | H, NW | 0 |
| 7 | 0.5 | 0 | 10000 | | center, 150mm/s, NW | H, NW | 0 |
| 8 | 1.0 | 0 | 10000 | 2 | center, 150mm/s, NW | H, NW | 0 |
| 9 | 6.5 | 1000 | 10000 | | H, NW | H, NW | 0 |
| 10 | 1.0 | 1000 | 10000 | 15 | DD, NW | H, NW | 0 |
| 11 | 0.5 | 0 | 10000 | | Dispn 2, 150mm/s W | H, NW | 0 |
| 12 | 10.0 | 2000 | 10000 | 1 | Dispn 3, 10 mm/s, NW | H, NW | 0 |
| 13 | 5.0 | 800 | 2000 | | H, NW | H, NW | 0 |
| 14 | 3.0 | 100 | 10000 | | H, NW | H, NW | 0 |
| 15 | 5.0 | 300 | 10000 | | H, NW | H, NW | 0 |
| 16 | 7.0 | 600 | 10000 | | H, NW | H, NW | 0 |
| 17 | 9.0 | 900 | 10000 | | H, NW | H, NW | 0 |
| 18 | 11.0 | 1200 | 10000 | | H, NW | H, NW | 0 |
| 19 | 3.0 | 1500 | 10000 | | H, NW | H, NW | 0 |
| 20 | 15.0 | 2000 | 10000 | | H, NW | H, NW | 0 |
| 21 | 15.0 | 2000 | 10000 | | H, NW | H, NW | 200 |
| 22 | 3.0 | 1500 | 10000 | 11,12 | H, NW | WE, W | 200 |
| 23 | 0.5 | 1500 | 10000 | 13 | H, NW | WE, 3 mm/s NW | 200 |
| 24 | 1.0 | 1500 | 10000 | 13 | H, NW | WE, 3 mm/s NW | 200 |
| 25 | 2.0 | 1500 | 10000 | 13,21 | H, NW | WE, 3 mm/s NW | 200 |
| 26 | 2.0 | 1500 | 10000 | 13 | H, NW | WE, 3 mm/s NW | 200 |
| 27 | 2.0 | 2000 | 10000 | | H, NW | | 200 |
| 28 | 1.0 | 0 | 10000 | | H, NW | | 200 |

Table 2

Recipe position data (mm)

| home | -57.91 | dummy dispn | 0 | center | 173.71 |
|---|---|---|---|---|---|
| end | 184.01 | dispense 2 | 79.99 | edge | 79.99 |
| | | dispense 3 | 172.7 | | |

Table 3

| Dsp # | Dsp name | Solvent | Flow rate |
|---|---|---|---|
| 1 | SOD nozzle 1 | Accuflo | 0.45 ml/s |
| 2 | Solvent nozzle 2 | PGMEA | 0.60 ml/s |
| 11 | Inner cup rinse | PGMEA | 300 |
| 12 | Outer cup rinse | PGMEA | 300 |
| 13 | Edge bead rinse | PGMEA | 30 |
| 15 | Nozzle 1 rinse | PGMEA | 30 |
| 16 | Nozzle 2 rinse | PGMEA | 30 |
| 21 | Backside rinse | PGMEA | 50 |

Table 4

Table 5

| Event | Time | RPM | ACC | DSP | Arm1 |
|---|---|---|---|---|---|
| 1 | 0.5 | 0 | 10000 |  | disp 1, 150 mm/s, W |
| 2 | 0.5 | 1000 | 10000 | 9 | disp 1, 150 mm/s, NW |
| 3 | 3.0 | 1500 | 10000 |  | disp 1, 150 mm/s, NW |
| 4 | 3.0 | 1500 | 10000 |  | disp 5, 150 mm/s, NW |
| 5 | 5.0 | 1500 | 10000 |  | disp 5, 150 mm/s, NW |
| 6 | 0.1 | 1000 | 10000 | 4 | disp 5, 150 mm/s, NW |
| 7 | 14.0 | 1000 | 10000 |  | center, 20 mm/s, NW |
| 8 | 2.0 | 800 | 10000 |  | center, 150 mm/s, NW |
| 9 | 3.0 | 100 | 10000 |  | home, 150 mm/s, NW |
| 10 | 4.0 | 300 | 10000 |  | home, 150 mm/s, NW |
| 11 | 5.0 | 600 | 10000 |  | home, 150 mm/s, NW |
| 12 | 6.0 | 900 | 10000 |  | home, 150 mm/s, NW |
| 13 | 6.0 | 1200 | 10000 |  | home, 150 mm/s, NW |
| 14 | 20.0 | 2000 | 9000 |  | home, 150 mm/s, NW |
| 15 | 1.0 | 1000 | 10000 |  | home, 150 mm/s, NW |
| 16 | 5.0 | 1500 | 9500 |  | home, 150 mm/s, NW |
| 17 | 5.0 | 1500 | 9500 | 13,21 | home, 150 mm/s, NW |
| 18 | 4.0 | 1500 | 9500 | 13,21 | home, 150 mm/s, NW |
| 19 | 10.0 | 2000 | 10000 | 13,21 | home, 150 mm/s, NW |

Table 6

| Pump recipe | |
|---|---|
| time | 14 s |
| volume | 6 ml |

| Recipe position data (mm) | | | |
|---|---|---|---|
| begin | 89 | center2 | 170.5 |
| end | 180 | edge | 87 |
| center1 | 170 | dispense 5 | 88 |
|  |  | dispense 1 | 170.5 |

Table 7

| Dsp # | Dsp name | Solvent | Flow rate |
|---|---|---|---|
| 4 | SOD nozzle 1 | Accuflo rev2 | use pump recipe |
| 9 | solvent | PGMEA | PGMEA pressure 0.1 Mpa |
| 13 | back side rinse | PGMEA | - |
| 21 | Edge bead rinse | PGMEA | - |

Table 8

| Step | Time (s) | Speed rpm | Acc rpm/s | Dsp | Arm1 | Arm2 | Exh flow |
|---|---|---|---|---|---|---|---|
| 1 | 1.0 | 0 | 10000 | | H, NW | H, NW | 200 |
| 2 | 0.5 | 0 | 10000 | | H, NW | H, NW | 200 |
| 3 | 0.5 | 0 | 10000 | 16 | DD, W | H, NW | 200 |
| 4 | 0.5 | 0 | 10000 | | DD, NW | H, NW | 200 |
| 5 | 0.5 | 0 | 10000 | | DD, NW | H, NW | 200 |
| 6 | 0.5 | 0 | 10000 | | DD, NW | H, NW | 0 |
| 7 | 0.5 | 0 | 10000 | | center, 150mm/s, NW | H, NW | 0 |
| 8 | 0.5 | 0 | 10000 | 2 | center, 150mm/s, NW | H, NW | 0 |
| 9 | 6.5 | 1000 | 10000 | | H, NW | H, NW | 0 |
| 10 | 1.0 | 1000 | 10000 | 16 | DD, NW | H, NW | |
| 11 | 0.5 | 0 | 10000 | | Dispn 2, 150mm/s W | H, NW | 0 |
| 12 | 14.0 | 2000 | 10000 | 1 | Dispn 3, 10 mm/s, NW | H, NW | 0 |
| 13 | 5.0 | 800 | 2000 | | H, NW | H, NW | 0 |
| 14 | 3.0 | 100 | 10000 | | H, NW | H, NW | 0 |
| 15 | 5.0 | 300 | 10000 | | H, NW | H, NW | 0 |
| 16 | 7.0 | 600 | 10000 | | H, NW | H, NW | 0 |
| 17 | 7.0 | 900 | 10000 | | H, NW | H, NW | 0 |
| 18 | 7.0 | 1200 | 10000 | | H, NW | H, NW | 0 |
| 19 | 3.0 | 1500 | 10000 | | H, NW | H, NW | 0 |
| 20 | 10.0 | 2000 | 10000 | | H, NW | H, NW | 0 |
| 21 | 10.0 | 2000 | 10000 | | H, NW | H, NW | 200 |
| 22 | 3.0 | 1500 | 10000 | 11,12 | H, NW | WE, W | 200 |
| 23 | 0.5 | 1500 | 10000 | 13 | H, NW | WE, 3 mm/s NW | 200 |
| 24 | 1.0 | 1500 | 10000 | 13 | H, NW | WE, 3 mm/s NW | 200 |
| 25 | 2.0 | 1500 | 10000 | 13,21 | H, NW | WE, 3 mm/s NW | 200 |
| 26 | 2.0 | 1500 | 10000 | 13 | H, NW | WE, 3 mm/s NW | 200 |
| 27 | 2.0 | 2000 | 10000 | | H, NW | | 200 |
| 28 | 1.0 | 0 | 10000 | | H, NW | | 200 |

Table 9

| Dsp # | Dsp name | Solvent | Flow rate |
|---|---|---|---|
| 1 | SOD nozzle 1 | Accuflo | 0.45 ml/s |
| 2 | Solvent nozzle 2 | PGMEA | 0.60 ml/s |
| 11 | Inner cup rinse | PGMEA | 300 |
| 12 | Outer cup rinse | PGMEA | 300 |
| 13 | Edge bead rinse | PGMEA | 30 |
| 15 | Nozzle 1 rinse | PGMEA | 30 |
| 16 | Nozzle 2 rinse | PGMEA | 30 |
| 21 | Backside rinse | PGMEA | 50 |

Table 10

| Rcp position | Location, mm |
|---|---|
| home | -57.91 |
| end | 184.01 |
| dummy | 0 |
| dispense 2 | 79.99 |
| dispense 3 | 172.7 |
| center | 173.71 |
| edge | 79.99 |

Table 11

| Event | Time | RPM | ACC | DSP | Arm 1 |
|---|---|---|---|---|---|
| 1 | 0.5 | 0 | 10000 |  | disp 1, 150 mm/s, W |
| 2 | 0.5 | 1000 | 10000 | 9 | disp 1, 150 mm/s, NW |
| 3 | 3.0 | 1500 | 10000 |  | disp 1, 150 mm/s, NW |
| 4 | 3.0 | 1500 | 10000 |  | disp 5, 150 mm/s, NW |
| 5 | 5.0 | 1500 | 10000 |  | disp 5, 150 mm/s, NW |
| 6 | 0.1 | 1000 | 10000 | 4 | disp 5, 150 mm/s, NW |
| 7 | 14.0 | 1000 | 10000 |  | center, 20 mm/s, NW |
| 8 | 2.0 | 800 | 10000 |  | center, 150 mm/s, NW |
| 9 | 3.0 | 100 | 10000 |  | home, 150 mm/s, NW |
| 10 | 4.0 | 300 | 10000 |  | home, 150 mm/s, NW |
| 11 | 5.0 | 600 | 10000 |  | home, 150 mm/s, NW |
| 12 | 6.0 | 900 | 10000 |  | home, 150 mm/s, NW |
| 13 | 6.0 | 1200 | 10000 |  | home, 150 mm/s, NW |
| 14 | 20.0 | 2000 | 9000 |  | home, 150 mm/s, NW |
| 15 | 1.0 | 1000 | 10000 |  | home, 150 mm/s, NW |
| 16 | 5.0 | 1500 | 9500 |  | home, 150 mm/s, NW |
| 17 | 5.0 | 1500 | 9500 | 13,21 | home, 150 mm/s, NW |
| 18 | 4.0 | 1500 | 9500 | 13,21 | home, 150 mm/s, NW |
| 19 | 10.0 | 2000 | 10000 | 13,21 | home, 150 mm/s, NW |

Table 12

| Pump recipe | |
|---|---|
| time | 14 s |
| volume | 6 ml |

| Recipe position data (mm) | | | |
|---|---|---|---|
| begin | 89 | center2 | 170.5 |
| end | 180 | edge | 87 |
| center1 | 170 | dispense 5 | 88 |
| | | dispense 1 | 170.5 |

Table 13

| Dsp # | Dsp name | Solvent | Flow rate |
|---|---|---|---|
| 4 | SOD nozzle 1 | Accuflo rev2 | use pump recipe |
| 9 | solvent | PGMEA | PGMEA pressure 0.1 Mpa |
| 13 | back side rinse | PGMEA | - |
| 21 | Edge bead rinse | PGMEA | - |

Table 14

| Sample # | Bake conditions | Accuflo 2027 TMAH Resistance | | |
|---|---|---|---|---|
| | | Th. Pre-TMAH Å | Th. Post-TMAH Å | ΔThickness Å |
| 1.1 | 160/180C 90s air | 20605 | 0 | 20605 |
| 1.2 | 160/180C 90s air | 20576 | 0 | 20576 |
| 2.1 | 160/200C 90s air | 19868 | 0 | 19868 |
| 2.2 | 160/200C 90s air | 19953 | 0 | 19953 |
| 3.1 | 160/220C 90s air | 18511 | 3550 | 14961 |
| 3.2 | 160/220C 90s air | 18540 | 4081 | 14459 |
| 13.1 | 160/230C 90s air | 17826 | 17828 | -2 |
| 14.1 | 160/240C 90s air | 17862 | 17856 | 6 |
| 15.1 | 160/250C 90s air | 17190 | 17168 | 22 |
| 7.1 | 160/180C 120s air | 20495 | 0 | 20495 |
| 7.2 | 160/180C 120s air | 20516 | 0 | 20516 |
| 8.1 | 160/200C 120s air | 19626 | 0 | 19626 |
| 8.2 | 160/200C 120s air | 19702 | 0 | 19702 |
| 16.1 | 160/210C 120s air | 19440 | 0 | 19440 |
| 9.1 | 160/220C 120s air | 18289 | 18295 | -6 |
| 9.2 | 160/220C 120s air | 18254 | 18247 | 7 |

Wafers were dipped two min. in 2.3% TMAH at RT.

Table 15

| Material | Accuflo2025 and Accuflo2027 Rev2 Planarization Comparison |||||||| 
| | ΔThickness trench array-support (nm) |||| ΔThickness trench array-support (nm) ||||
| | standard process || BKM process || standard process || BKM process ||
| | center | edge | center | edge | center | edge | center | edge |
|---|---|---|---|---|---|---|---|---|
| Accuflo2025 | 12000 | 850 | 650 | 450 | 12000 | | 700 | |
| 1513EL | 900 | 550 | 500 | 350 | | | | |
| Accuflo2027 | 600 | 400 | 380 | 220 | 750 | | 260 | 150 |

| Film thx. at various locations. | Wafer Center, nm | Wafer Midpoint, nm | Wafer Edge, nm |
|---|---|---|---|
| Thx. over trench array center | 1910 | 1810 | 1810 |
| Thx. over trench array edge | 1810 | 1810 | 1950 |
| Thx. over topography | 1790 | 1860 | 1910 |
| Thx. over periphery | 1860 | 1910 | 1950 |
| Chip-level thx. diff | 120 | 100 | 140 |
| Chip-level max. thx. diff | | 140 | |
| Wafer-level max. thx. diff | | 160 | |

$\Delta \text{Thickness}_{\text{max. topography-periphery}} = 160 \text{ nm}$

Table 16

Table 17

| Run | Bake | | | Ambient | Etchant | Exposure Time | Pre-etch | | Post-etch | |
|---|---|---|---|---|---|---|---|---|---|---|
| | BP1 | BP2 | BP3 | | | | Thx, Å | RI | Thx, Å | RI |
| 1 | 160°C (120 s) | 180°C (120 s) | | air | 500:1 BOE | 2 min | | | | |
| 2 | 160°C (120 s) | 180°C (120 s) | | air | 500:1 BOE | 5 min | | | | |
| 3 | 160°C (120 s) | 200°C (120 s) | | air | 500:1 BOE | 2 min | | | | |
| 4 | 160°C (120 s) | 200°C (120 s) | | air | 500:1 BOE | 5 min | | | | |
| 5 | 160°C (120 s) | 180°C (120 s) | 200°C (120 s) | air | 500:1 BOE | 2 min | | | | |
| 6 | 160°C (120 s) | 180°C (120 s) | 200°C (120 s) | air | 500:1 BOE | 5 min | | | | |
| 7 | 160°C (120 s) | 200°C (120 s) | 200°C (120 s) | air | 500:1 BOE | 2 min | | | | |
| 8 | 160°C (120 s) | 200°C (120 s) | 200°C (120 s) | air | 500:1 BOE | 5 min | | | | |
| 9 | 160°C (120 s) | 200°C (120 s) | 210°C (120 s) | air | 500:1 BOE | 2 min | | | | |
| 10 | 160°C (120 s) | 200°C (120 s) | 210°C (120 s) | air | 500:1 BOE | 5 min | | | | | complete resistance to 500:1 BOE

PLANARIZATION FILMS FOR ADVANCED MICROELECTRONIC APPLICATIONS AND DEVICES AND METHODS OF PRODUCTION THEREOF

This application claims priority to U.S. Provisional Application Ser. No. 60/488,484 filed on Jul. 17, 2003 and Patent Cooperation Treaty Application Serial No. PCT/US03/34347 filed on Oct. 27, 2003, which are both commonly owned and incorporated herein in their entirety.

FIELD OF THE SUBJECT MATTER

The field of the subject matter is planarization compositions and films for use in microelectronic and semiconductor applications, including their methods of production.

BACKGROUND

To meet the requirements for faster performance, the characteristic dimensions of features of integrated circuit devices have continued to be decreased. Manufacturing of devices with smaller feature sizes introduces new challenges in many of the processes conventionally used in semiconductor fabrication. One of the challenges of producing microelectronic devices and using them in various applications is the global planarization of a surface having a non-planar surface topography.

Planarization of a surface generally comprises utilizing one or both of two different actions: a) adding to the surface, or b) subtracting from the surface. The action of subtracting from the surface usually means that the surface is polished or otherwise physically or chemically etched in order to remove any unwanted surface topography and minimize/remove any gaps. The action of adding to the surface usually means adding another layer to the surface topography to fill any gaps and create a smooth surface.

Planarization by addition is not satisfactory where the film thickness measured at the open field area is substantially greater than that at the surface of the topography. If the film thickness difference between the topography and open field area is too large, a high risk of yield loss at the final device develops. In addition, planarization by addition is not satisfactory or desirable if the planarization composition cannot adequately fill gaps on the surface, especially the small channels and grooves that are formed on the underlying surface, and in effect leaves small channels that are not filled with planarization composition at all, but are instead filled with air or another atmospheric gas.

To this end, it would be desirable to form and utilize a planarization composition that can a) provide a film thickness that, when measured at the open field area, is not substantially greater than that at the surface of the topography; b) adequately gap fill in narrow trenches and channels; c) be formed using conventional structural and solvent constituents; d) withstand incorporation of other composition-modifying constituents, such as surfactants; and e) planarize a surface or substrate to form a component that can be easily incorporated into an electronic or semiconductor application.

SUMMARY OF THE SUBJECT MATTER

A planarization composition is disclosed herein that comprises: a) a structural constituent; and b) a solvent system, wherein the solvent system is compatible with the structural constituent and lowers at least one of the intermolecular forces or surface forces components of the planarization composition. A film that includes this planarization composition is also disclosed.

In addition, another planarization composition is disclosed herein that comprises: a) a cresol-based polymer compound; and b) a solvent system comprising at least one alcohol and at least one ether acetate-based solvent. A film that includes this planarization composition is also disclosed.

A layered component is also disclosed herein that comprises: a) a substrate having a surface topography; and b) a planarization composition or a film such as those described herein, wherein the composition is coupled to the substrate.

Methods of forming a planarization compositions are also disclosed herein that comprise: a) providing a structural constituent; b) providing a solvent system, wherein the solvent system is compatible with the structural constituent and lowers at least one of the intermolecular forces or surface forces components of the planarization composition; and c) blending the structural constituent and the solvent system to form a planarization composition.

Methods of forming a film are also disclosed that comprise: a) providing a planarization composition such as those disclosed herein; and b) evaporating at least part of the solvent system to form a film.

BRIEF DESCRIPTION OF THE FIGURES & TABLES

Figure 1:
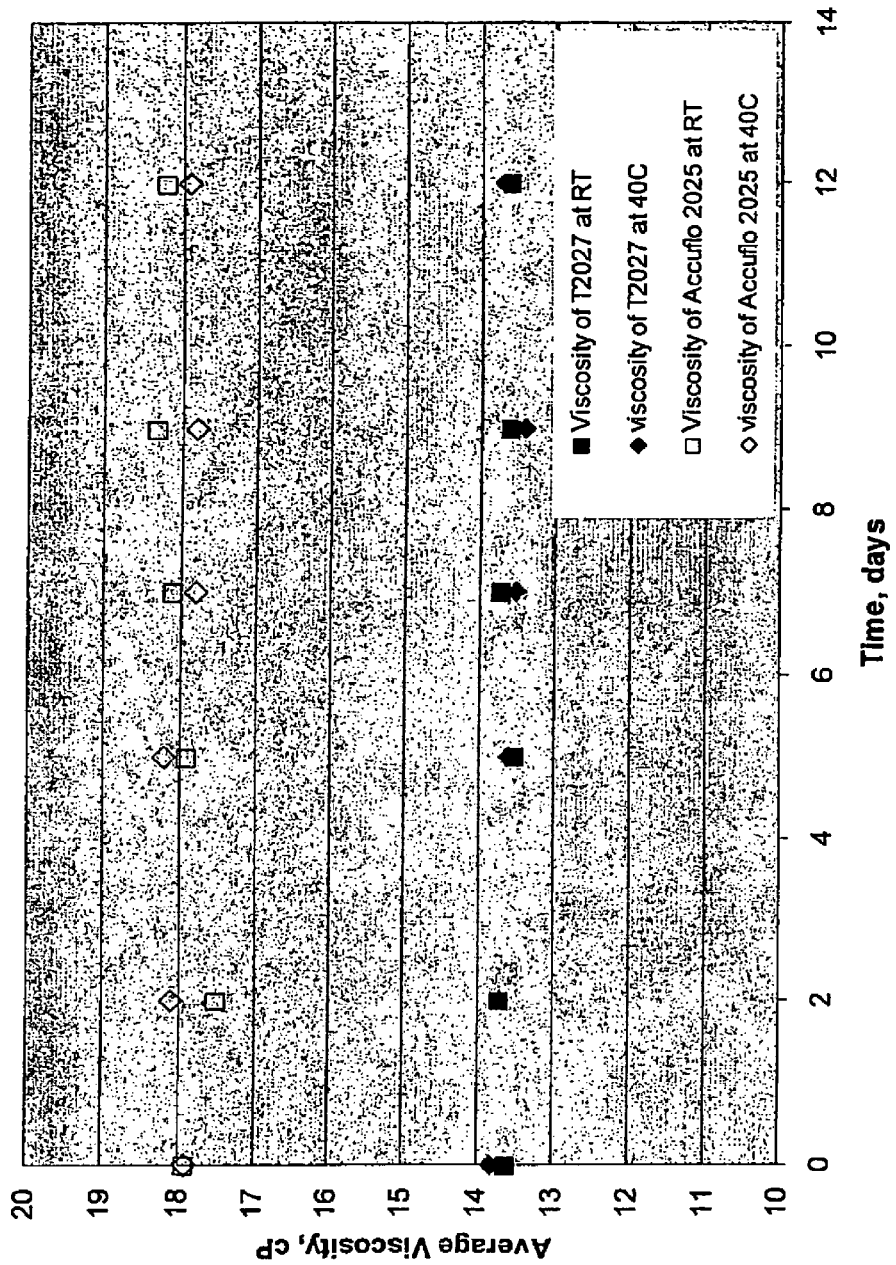
FIG. 1 shows a fluid property comparison for two contemplated planarization compositions.

Table 1 shows the structural information for the composition once the starting composition has been deposited onto a surface or wafer and baked and/or cured.

Table 2 shows the planarization performance for the Accuflo™ 2025 composition tested in two different laboratories.

Table 3 shows the planarization performance for the Accuflo™ 2025 composition tested in two different laboratories.

Table 4 shows show the planarization performance for the Accuflo™ 2025 composition tested in two different laboratories.

Table 5 shows the planarization performance for the Accuflo™ 2025 composition tested in two different laboratories.

Table 6 shows the planarization performance for the Accuflo™ 2025 composition tested in two different laboratories.

Table 7 shows the planarization performance for the Accuflo™ 2025 composition tested in two different laboratories.

Table 8 shows the planarization performance for the Accuflo™ 2027 composition tested in two different laboratories.

Table 9 shows the planarization performance for the Accuflo™ 2027 composition tested in two different laboratories.

Table 10 shows the planarization performance for the Accuflo™ 2027 composition tested in two different laboratories.

Table 11 shows the planarization performance for the Accuflo™ 2027 composition tested in two different laboratories.

Table 12 shows the planarization performance for the Accuflo™ 2027 composition tested in two different laboratories.

Table 13 shows the planarization performance for the Accuflo™ 2027 composition tested in two different laboratories.

Table 14 shows the TMAH solvent resistance of the Accuflo™ 2027 when baked at about 160° C. to about 230° C. for about 90 seconds in ambient air.

Table 15 shows a planarization comparison between two contemplated compositions.

Table 16 shows the SEM cross section results for contemplated compounds.

Table 17 shows the BOE etch results for this same composition shown in Table 16.

DETAILED DESCRIPTION

As described herein, a planarization composition has been developed and utilized that comprises at least one of the following goals and advantages: a) provides a film thickness that, when measured at the open field area, is not substantially greater than that at the surface of the topography; b) adequately gap fills in narrow trenches and channels; c) is formed using conventional structural and solvent constituents; d) withstands incorporation of other composition-modifying constituents, such as surfactants; and e) planarizes a surface or substrate to form a component that can be easily incorporated into an electronic or semiconductor application.

In contemplated embodiments, a planarization composition comprises a structural constituent and a solvent system, wherein the solvent system is compatible with the structural constituent and effectively lowers at least one of the intermolecular forces or surface forces components of the planarization composition. In additional contemplated embodiments, the planarization composition may further comprise a composition-modifying constituent, such as a surfactant.

The structural constituent of the planarization composition may comprise any suitable monomer, polymer, moiety or compound that is suitable as a planarization material for electronic and semiconductor applications. These monomers, polymers, moieties or compounds can comprise organic, inorganic or organometallic moieties. Examples of contemplated inorganic compounds are silicates, siloxanes, silazanes, aluminates and compounds containing transition metals. Examples of organic compounds include polyarylene ether, polyimides, adamantane molecules, branched adamantane structures, novolac-based polymers and polyesters. Examples of contemplated organometallic compounds include poly(dimethylsiloxane), poly(vinylsiloxane) and poly(trifluoropropylsiloxane).

As used herein, the term "monomer" refers to any chemical compound that is capable of forming a covalent bond with itself or a chemically different compound in a repetitive manner. The repetitive bond formation between monomers may lead to a linear, branched, super-branched, or three-dimensional product. Furthermore, monomers may themselves comprise repetitive building blocks, and when polymerized the polymers formed from such monomers are then termed "blockpolymers". Monomers may belong to various chemical classes of molecules including organic, organometallic or inorganic molecules. The molecular weight of monomers may vary greatly between about 40 Dalton and 20000 Dalton. However, especially when monomers comprise repetitive building blocks, monomers may have even higher molecular weights. Monomers may also include additional groups, such as groups used for crosslinking.

One of the planarization compositions that experiences some problems when comparing the film thickness measured at the open field area to that at the surface of the topography is the planarization composition that comprises a novolac-based polymer. Novolac-based polymer solutions contemplated herein are those disclosed in U.S. Pat. Nos. 6,506,831; 6,506,441; 6,517,951; U.S. patent application Ser. No. 10/299,127 and related and corresponding foreign and PCT applications, including PCT/US99/30296, which are all incorporated herein in their entirety and are commonly owned and assigned to Honeywell International Inc. Other contemplated novolac-based polymer solutions are those disclosed in the following references: Rahman et al. (U.S. Pat. No. 5,853,954 and U.S. Pat. No. 5,910,559); Malik et al. (U.S. Pat. No. 6,027,853); Allen et al. (SPIE Vol. 2438, pp. 250-260); Tsiartas et al. (SPIE Vol. 2438, pp. 261-271) or Sizensky et al. (U.S. Pat. No. 5,413,894), which are all incorporated herein by reference. Another class of compositions that are contemplated herein are resol-type phenolic resins. It should be understood that any of the planarization compositions discussed herein may be combined with one another to form another planarization composition. For example, a novolac-based polymer may be combined with a resol-type phenolic resin to form a planarization composition. It should be understood that planarization improves as the structure of the molecular approaches a linear or straight-chained configuration. Branched or crosslinked molecules and compounds can be utilized in a planarization composition, but it should be understood that as the molecules and compounds become larger (from a molecular weight sense) and more complex (from a branched/crosslinked sense) that the successful planarization of a surface may begin to suffer.

Solutions of organohydridosiloxane and organosiloxane resins can also be utilized for forming planarization compositions and also in the fabrication of a variety of electronic devices, micro-electronic devices, particularly semiconductor integrated circuits and various layered materials for electronic and semiconductor components, including hardmask layers, dielectric layers, etch stop layers and buried etch stop layers. These organohydridosiloxane resin layers are quite compatible with other materials that might be used for layered materials and devices, such as adamantane-based compounds, diamantane-based compounds, silicon-core compounds, organic dielectrics, and nanoporous dielectrics. Compounds that are considerably compatible with the organohydridosiloxane resin planarization layers contemplated herein are disclosed in PCT Application PCT/US01/32569 filed Oct. 17, 2001; PCT Application PCT/US01/50812 filed Dec. 31, 2001; U.S. application Ser. No. 09/538,276; U.S. application Ser. No. 09/5/14504; U.S. application Ser. No. 09/587,851; U.S. Pat. No. 6,214,746; U.S. Pat. No. 6,171,687; U.S. Pat. No. 6,172,128; U.S. Pat. No. 6,156,812, U.S. Application Ser. No. 60/350,187 filed Jan. 15, 2002; and U.S. 60/347,195 filed Jan. 8, 2002, which are all incorporated herein by reference in their entirety.

Organohydridosiloxane resins utilized herein have the following general formulas:

$$[H\text{—}Si_{1.5}]_n[R\text{—}SiO_{1.5}]_m \quad \text{Formula (1)}$$

$$[H_{0.5}\text{—}Si_{1.5\text{-}1.8}]_n[R_{0.5\text{-}1.0}\text{—}SiO_{1.5\text{-}1.8}]_m \quad \text{Formula (2)}$$

$$[H_{0\text{-}1.0}\text{—}Si_{1.5\text{-}1.8}]_n[R_{0.5\text{-}1.0}\text{—}SiO_{1.5\text{-}1.8}]_m \quad \text{Formula (3)}$$

$$[H\text{—}Si_{1.5}]_x[R\text{—}SiO_{1.5}]_y[SiO_2]_z \quad \text{Formula (4)}$$

wherein:

the sum of n and m, or the sum or x, y and z is from about 8 to about 5000, and m or y is selected such that carbon containing constituents are present in either an amount of less than about 40 percent (Low Organic Content=LOSP) or in an amount greater than about 40 percent (High Organic Content=HOSP); R is selected from substituted and unsubstituted, normal and branched alkyls (methyl, ethyl, butyl, propyl, pentyl), alkenyl groups (vinyl, allyl, isopropenyl), cycloalkyls, cycloalkenyl groups, aryls (phenyl groups, benzyl groups, naphthalenyl groups, anthracenyl groups and phenanthrenyl groups); and mixtures thereof; and wherein the specific mole percent of carbon containing substituents is a function of the ratio of the amounts of starting materials. In some LOSP embodiments, particularly favorable results are obtained with the mole percent of carbon containing substituents being in the range of between about 15 mole percent to about 25 mole percent. In some HOSP embodiments, favorable results are obtained with the mole percent of carbon containing substituents are in the range of between about 55 mole percent to about 75 mole percent.

The phrases "cage structure", "cage molecule", and "cage compound" are intended to be used interchangeably and refer to a molecule having at least 10 atoms arranged such that at least one bridge covalently connects two or more atoms of a ring system. In other words, a cage structure, cage molecule or cage compound comprises a plurality of rings formed by covalently bound atoms, wherein the structure, molecule or compound defines a volume, such that a point located with the volume can not leave the volume without passing through the ring. The bridge and/or the ring system may comprise one or more heteroatoms, and may be aromatic, partially saturated, or unsaturated. Further contemplated cage structures include fullerenes, and crown ethers having at least one bridge. For example, an adamantane or diamantane is considered a cage structure, while a naphthalene or an aromatic spirocompound are not considered a cage structure under the scope of this definition, because a naphthalene or an aromatic spirocompound do not have one, or more than one bridge.

Contemplated cage compounds need not necessarily be limited to being comprised solely of carbon atoms, but may also include heteroatoms such as N, S, O, P, etc. Heteroatoms may advantageously introduce non-tetragonal bond angle configurations. With respect to substituents and derivatizations of contemplated cage compounds, it should be recognized that many substituents and derivatizations are appropriate. For example, where the cage compounds are relatively hydrophobic, hydrophilic substituents may be introduced to increase solubility in hydrophilic solvents, or vice versa. Alternatively, in cases where polarity is desired, polar side groups may be added to the cage compound. It is further contemplated that appropriate substituents may also include thermolabile groups, nucleophilic and electrophilic groups. It should also be appreciated that functional groups may be employed in the cage compound (e.g., to facilitate crosslinking reactions, derivatization reactions, etc.) Where the cage compounds are derivatized, it is especially contemplated that derivatizations include halogenation of the cage compound, and a particularly preferred halogen is fluorine.

Cage molecules or compounds, as described in detail herein, can also be groups that are attached to a polymer backbone, and therefore, can form nanoporous materials where the cage compound forms one type of void (intramolecular) and where the crosslinking of at least one part of the backbone with itself or another backbone can form another type of void (intermolecular). Additional cage molecules, cage compounds and variations of these molecules and compounds are described in detail in PCT/US01/32569 filed on Oct. 18, 2001, which is herein incorporated by reference in its entirety.

In order to improve the gap-filling and planarization abilities of a composition that comprises monomers or other non-polymer species and/or a polymeric constituent, the composition should be modified in order to modify the viscosity, the surface forces component and/or the intermolecular forces component of the planarization composition, such as the surface energy of the composition. In several cases, it is beneficial to lower both the viscosity and the intermolecular forces constituent in order to optimize the gap-filling and planarization properties. One way to modify the planarization composition is to modify and/or replace the solvent system, wherein the solvent system wherein the system is compatible with the structural constituent and lowers at least one of the intermolecular forces or surface forces components of the planarization composition to which it is added. In some contemplated embodiments, the solvent system comprises at least two solvents.

For example, in a novolac-based polymeric solution, a strongly hydrogen-bonding solvent is used to dissolve the surfactant that is added to the polymeric solution. In one instance, the strongly hydrogen-bonding solvent is ethyl lactate and the surfactant is a fluoroaliphatic polymeric ester surfactant. For this case, the strongly hydrogen-bonding solvent can be replaced by a co-solvent system comprising an alcohol, such as 2-propanol and propylene glycol methyl ether acetate (PGMEA). Utilizing to the Hildebrand and Hansen solubility parameters, it is believed that the solubility of fluoroaliphatic polymeric ester surfactant in 2-propanol is similar to that of PGMEA, however, superior to ethyl lactate. In addition, 2-propanol possesses weaker intermolecular forces and lower surface tension than ethyl lactate. The capillary flow in narrow trenches is affected by the molecular structure and associated electrical charge. Representing integral effects of surface forces, the apparent viscosity of moderately polar 2-propanol decreases from its nominal value at narrow trench regime, where the ratio between apparent and nominal viscosity for ethyl lactate is larger than that of 2-propanol. Addition of PGMEA to 2-propanol in the co-solvent system for the surfactant reduces the evaporation rate difference between 2-propanol and bulk PGMEA used for cresol-novolac resin dilution. In contemplated embodiments, the solvent system lowers the apparent viscosity by at least about 10%. In other contemplated embodiments, the solvent system lowers the apparent viscosity by at least about 20%. In yet other contemplated embodiments, the solvent system lowers the apparent viscosity by at least about 30%.

As used herein, the phrase "apparent viscosity" means the characteristic of fluid's internal resistance to flow and which equals the ratio of stress to the rate of strain. In submicron trenches, the apparent viscosity represents the integral effect of surface forces and usually decreases from the nominal viscosity due to the size effect where the ratio between surface force and body force is large. Also as used herein, the phrase "nominal viscosity" means that viscosity that is the bulk fluid property determined from a commercially available viscometer, such as a Brookfield viscometer, and is calculated from measurements of forces and velocities when liquid is Newtonian.

Contemplated solvents to be utilized in the solvent system are those mentioned earlier along with those that include any suitable pure or mixture of organic molecules that are volatilized at a desired temperature and/or easily solvates the chosen surfactants, polymers and/or other molecules discussed herein. Contemplated solvents are also those solvents that can, alone or in combination, modify the viscosity, intermolecular forces and surface energy of the solution in order to improve the gap-filling and planarization properties. The solvent may also comprise any suitable pure or mixture of polar and non-polar compounds. As used herein, the term "pure" means that component that has a constant composition. For example, pure water is composed solely of $H_2O$. As used herein, the term "mixture" means that component that is not pure, including salt water. As used herein, the term "polar" means that characteristic of a molecule or compound that creates an unequal charge, partial charge or spontaneous charge distribution at one point of or along the molecule or compound. As used herein, the term "non-polar" means that characteristic of a molecule or compound that creates an equal charge, partial charge or spontaneous charge distribution at one point of or along the molecule or compound.

In some contemplated embodiments, the solvent or solvent mixture may comprise those solvents that are not considered part of the hydrocarbon solvent family of compounds, such as ketones, such as acetone, diethyl ketone, methyl ethyl ketone and the like, alcohols (branched and straight chain, such as 2-propanol or 1-propanol), esters, ethers, ether acetates and amines. In yet other contemplated embodiments, the solvent or solvent mixture may comprise a combination of any of the solvents mentioned herein.

In other contemplated embodiments, the solvent or solvent mixture (comprising at least two solvents) comprises those solvents that are considered part of the hydrocarbon family of solvents. Hydrocarbon solvents are those solvents that comprise carbon and hydrogen. It should be understood that a majority of hydrocarbon solvents are non-polar; however, there are a few hydrocarbon solvents that could be considered polar. Hydrocarbon solvents are generally broken down into three classes: aliphatic, cyclic and aromatic. Aliphatic hydrocarbon solvents may comprise both straight-chain compounds and compounds that are branched and possibly crosslinked, however, aliphatic hydrocarbon solvents are not considered cyclic. Cyclic hydrocarbon solvents are those solvents that comprise at least three carbon atoms oriented in a ring structure with properties similar to aliphatic hydrocarbon solvents. Aromatic hydrocarbon solvents are those solvents that comprise generally three or more unsaturated bonds with a single ring or multiple rings attached by a common bond and/or multiple rings fused together. Contemplated hydrocarbon solvents include toluene, xylene, p-xylene, ma-xylene, mesitylene, solvent naphtha H, solvent naphtha A, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, nitrated hydrocarbons, benzene, 1,2-dimethylbenzene, 1,2,4-trimethylbenzene, mineral spirits, kerosine, isobutylbenzene, methylnaphthalene, ethyltoluene, ligroine. Particularly contemplated solvents include, but are not limited to, pentane, hexane, heptane, cyclohexane, benzene, toluene, xylene and mixtures or combinations thereof.

As used herein, the phrase "intermolecular forces" means those bonding or non-bonding forces, such as Van der Waals, electrostatic, steric, coulombic, hydrogen bonding, ionic, covalent, dipole-dipole, dispersion, magnetic attraction and combinations thereof, that take place between two or more parts of matter or components, such as a planarization composition and a surface, a planarization composition and another layer of material, molecules that make up the planarization composition, combinations thereof and so on. When lowering the intermolecular forces of a planarization composition, it is important to use a "reference" planarization composition, such as the one described above consisting of a novolac-based polymer, ethyl lactate and a surfactant. When the solvent system of the reference planarization composition is replaced, such as that described above comprising 2-propanol and PGMEA, the intermolecular forces are lowered and the planarization composition is not detrimentally and strongly attracted to the surface of the substrate or to other molecules. In this case, the planarization composition is free to migrate into the narrow gaps and trenches that make up the surface topography. It should be understood that the reference composition may comprise any combination of structural constituents and solvent systems. It should be further understood that whatever reference planarization composition is chosen, a compatible solvent system may be easily developed using the disclosure herein to lower the intermolecular forces component of the composition.

In some embodiments, a surface forces component, such as an interfacial surface tension, is created by the planarization composition and the interaction of the planarization composition with the surface, substrate or wafer. Solvent systems contemplated herein can lower the interfacial surface tension by at least about 10% when compared to a conventional planarization composition known to one of ordinary skill in the art of layered materials. In some embodiments, the solvent system can lower the interfacial surface tension by at least about 20% when compared to a conventional planarization composition. In yet other embodiments, the solvent system can lower the interfacial surface tension by at least about 30% when compared to a conventional planarization composition.

As mentioned earlier, in additional contemplated embodiments, the planarization composition may further comprise at least one composition-modifying constituent, such as a surfactant. Contemplated surfactants include hydrocarbon-based (non-fluorinated) and fluorocarbon-based surfactants or a combination thereof. As contemplated, the at least one fluorocarbon-type surfactant may comprise at least one fluoroaliphatic polymeric ester surfactant. Suitable non-fluorinated surfactants are those found in U.S. Pat. Nos. 5,858,547 and 6,517,951 issued to Hacker et al., which are commonly-owned, assigned and incorporated herein by reference in their entirety. Other composition-modifying constituents may comprise at least one adhesion promoter, pH tuning agent, porogen or any other suitable composition-modifying agent depending on the needs and specifications of the film, the component and/or the vendor.

There are several characteristics of a suitable planarization film that are both desirable and contemplated herein. A contemplated characteristic of the composition is the polydispersity of the composition. Polydispersity is the ratio of weight-average molecular weight (Mw) to number-average molecular weight (Mn). Therefore, the closer the weight-average molecular weight is to the number-average molecular weight, the closer the polydispersity is to 1, which is the lowest polydispersity number possible. As polydispersity approaches 1, the constituents in the composition are closer in molecular weight with little variation in the range of molecular weights in the composition. It has been found that constituents that are not the same or near the same molecular weight as the structural constituent can greatly influence the properties of the film and component incorporating that film. For example, the presence of low-molecular weight constituents in the composition (less than 350 amu) can cause fuming and/or smoking and film degradation upon baking and curing of the film. In contemplated embodiments, the polydispersity is less than about 3. In other contemplated embodiments, the polydispersity is less than about 2.5. In yet other contemplated embodiments, the polydispersity is less than about 2. And in additional contemplated embodiments, the polydispersity is less than about 1.5.

The planarization compositions described herein may be used to form films. One method of forming a film comprises: a) providing at least one planarization composition disclosed herein, wherein the planarization composition comprises a solvent system; and b) evaporating at least part of the solvent system to form a film. Any suitable procedure or condition may be used to remove or at least partially remove the solvent system, including continuous sources, such as heat, dissolution in solvents, preferential etching, exposure to radiation, electromagnetic radiation, such as ultraviolet, x-ray, point sources, such as a laser, or infrared radiation; mechanical energy, such as sonication or physical pressure; or particle radiation, such as gamma ray, alpha particles, neutron beam or electron beam as taught by commonly owned patent publication PCT/US96/08678 and U.S. Pat. Nos. 6,042,994; 6,080,526; 6,177,143; and 6,235,353, which are commonly owned and incorporated herein by reference in their entireties.

As a contemplated use or application, a layered component is also contemplated herein and comprises: a substrate having a surface topography; a planarization solution and/or film as described herein, wherein the film and/or material is coupled to the substrate; and optionally at least one additional layer of material or film. Contemplated coating materials, coating solutions and films can be utilized are useful in the fabrication of a variety of electronic devices, micro-electronic devices, particularly semiconductor integrated circuits and various layered materials for electronic and semiconductor components, including hardmask layers, dielectric layers, etch stop layers and buried etch stop layers. These coating materials, coating solutions and films are quite compatible with other materials that might be used for layered materials and devices, such as adamantane-based compounds, diamantane-based compounds, silicon-core compounds, organic dielectrics, and nanoporous dielectrics. Compounds that are considerably compatible with the coating materials, coating solutions and films contemplated herein are disclosed in PCT Application PCT/US01/32569 filed Oct. 17, 2001; PCT Application PCT/US01/5081.2 filed Dec. 31, 2001; U.S. application Ser. No. 09/538,276; U.S. application Ser. No. 09/544,504; U.S. application Ser. No. 09/587,851; U.S. Pat. No. 6,214,746; U.S. Pat. No. 6,171,687; U.S. Pat. No. 6,172,128; U.S. Pat. No. 6,156,812; U.S. Application Ser. No. 60/350,187 filed Jan. 15, 2002; and U.S. 60/347,195 filed Jan. 8, 2002, which are all incorporated herein by reference in their entirety.

Surfaces contemplated herein may comprise any desirable substantially solid material, such as a substrate, wafer or other suitable surface. Some contemplated surfaces comprise a non-planar surface topography and other contemplated surfaces have already been planarized. Particularly desirable substrate layers would comprise films, glass, ceramic, plastic, metal or coated metal, or composite material. Surface and/or substrate layers comprise at least one layer and in some instances comprise a plurality of layers. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and its oxides), a polymer-based packaging or board interface such as found in a polyimide-based flex package, lead or other metal alloy solder ball surface, glass and polymers such as polyimide. In more preferred embodiments, the substrate comprises a material common in the integrated circuit industries as well as the packaging and circuit board industries such as silicon, copper, glass, and another polymer. Suitable surfaces contemplated herein may also include another previously formed layered stack, other layered component, or other component altogether. An example of this may be where a dielectric material and CVD barrier layer are first laid down as a layered stack—which is considered the "surface" for the subsequently spun-on layered component.

At least one layer is coupled to the surface or substrate. As used herein, the term "coupled" means that the surface and layer or two layers are physically attached to one another or there's a physical attraction between two parts of matter or components, including bond forces such as covalent and ionic bonding, and non-bond forces such as Van der Waals, electrostatic, coulombic, hydrogen bonding and/or magnetic attraction. Also, as used herein, the term coupled is meant to encompass a situation where the surface and layer or two layers are directly attached to one another, but the term is also meant to encompass the situation where the surface and the layer or plurality of layers are coupled to one another indirectly—such as the case where there's an adhesion promoter layer between the surface and layer or where there's another layer altogether between the surface and layer or plurality of layers.

Contemplated dielectric and low dielectric materials comprise inorganic-based compounds, such as silicon-based disclosed in commonly assigned U.S. Pat. No. 6,143,855 and pending U.S. Ser. No. 10/078,919 filed Feb. 19, 2002; (for example Honeywell NANOGLASS® and HOSP® products), gallium-based, germanium-based, arsenic-based, boron-based compounds or combinations thereof, and organic-based compounds, such as polyethers, polyarylene ethers disclosed in commonly assigned U.S. Pat. No. 6,124,421 (such as Honeywell FLARE™ product), polyimides, polyesters and adamantane-based or cage-based compounds disclosed in commonly assigned WO 01/78110 and WO 01/08308 (such as Honeywell GX-3™ product). The dielectric and low dielectric materials may be applied by spin coating the material on to the surface, rolling the material on to the surface, dripping the material on to the surface, and/or spreading the material on to the surface.

Nanoporous silica dielectric films with dielectric constants ranging from 1.5 to about 3.8 can be also as at least one of the layers. Nanoporous silica compounds contemplated herein are those compounds found in U.S. Pat. Nos. 6,022,812; 6,037,275; 6,042,994; 6,048,804; 6,090,448; 6,126,733; 6,140,254; 6,204,202; 6,208,041; 6,318,124 and 6,319,855. These types of films are laid down as a silicon-based precursor, aged or condensed in the presence of water and heated sufficiently to remove substantially all of the porogen and to form voids in the film. The silicon-based precursor composition comprises monomers or prepolymers that have the formula: $R_x$—Si-$L_y$, wherein R is independently selected from alkyl groups, aryl groups, hydrogen and combinations thereof, L is an electronegative moiety, such as alkoxy, carboxy, amino, amido, halide, isocyanato and combinations thereof, x is an integer ranging from 0 to about 2, and y is an integer ranging from about 2 to about 4. Other nanoporous compounds and methods can be found in U.S. Pat. Nos. 6,156,812; 6,171,687; 6,172,128; 6,214,746; 6,313,185; 6,380,347; and 6,380,270, which are incorporated herein in their entirety.

The layered component contemplated herein may also comprise a diffusion blocking material that is not on the component in the form of a layer, but is instead being used to "block" any individual pores/voids and not to cover the entire underlying layer. In some embodiments, the diffusion blocking material will react with the underlying low k dielectric material or layer and in other embodiments. The diffusion blocking material will not be reactive with the underlying low k dielectric material or layer. In other embodiments the diffusion blocking layered component contemplated may consist of a densified layer of the low k material or contain phase separated elements of the low k material densified in such a manner as to block diffusion of species. Diffusion blocking materials, such as those contemplated herein, can be found in commonly-owned U.S. Provisional Application 60/385,482 filed on Jun. 3, 2002, which is incorporated herein in its entirety.

Other spin-on materials may be utilized in additional layers of the layered component. Several of the contemplated spin-on materials are described in the following issued patents and pending applications, which are herein incorporated by reference in their entirety: (PCT/US00/15772 filed Jun. 8, 2000; U.S. application Ser. No. 09/330,248 filed Jun. 10, 1999; U.S. application Ser. No. 09/491,166 filed Jun. 10, 1999; U.S. Pat. No. 6,365,765 issued on Apr. 2, 2002; U.S. Pat. No. 6,268,457 issued on Jul. 31, 2001; U.S. application Ser. No. 10/001,143 filed Nov. 10, 2001; U.S. application Ser. No. 09/491,166 filed Jan. 26, 2000; PCT/US00/00523 filed Jan. 7, 1999; U.S. Pat. No. 6,177,199 issued Jan. 23, 2001; U.S. Pat. No. 6,358,559 issued Mar. 19, 2002; U.S. Pat. No. 6,218,020 issued Apr. 17, 2001; U.S. Pat. No. 6,361,820 issued Mar. 26, 2002; U.S. Pat. No. 6,218,497 issued Apr. 17, 2001; U.S. Pat. No. 6,359,099 issued Mar. 19, 2002; U.S. Pat. No. 6,143,855 issued Nov. 7, 2000; and U.S. application Ser. No. 09/611,528 filed Mar. 20, 1998).

As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include indium, silver, copper, aluminum, tin, bismuth, gallium and alloys thereof, silver coated copper, and silver coated aluminum. The term "metal" also includes alloys, metal/metal composites, metal ceramic composites, metal polymer composites, as well as other metal composites. As used herein, the term "compound" means a substance with constant composition that can be broken down into elements by chemical processes.

Additional layers of material may be coupled to the layered component in order to continue building a layered component or printed circuit board. It is contemplated that the additional layers will comprise materials similar to those already described herein, including metals, metal alloys, composite materials, polymers, monomers, organic compounds, inorganic compounds, organometallic compounds, resins, adhesives and optical wave-guide materials.

A layer of laminating material or cladding material can be coupled to the layered interface materials depending on the specifications required by the component. Laminates are generally considered fiber-reinforced resin dielectric materials. Cladding materials are a subset of laminates that are produced when metals and other materials, such as copper, are incorporated into the laminates. (Harper, Charles A., *Electronic Packaging and Interconnection Handbook*, Second Edition, McGraw-Hill (New York), 1997.)

Spin-on layers and materials may also be added to the layered interface materials or subsequent layers. Spin-on stacked films are taught by Michael E. Thomas, "Spin-On Stacked Films for Low $k_{eff}$ Dielectrics", *Solid State Technology* (July 2001), incorporated herein in its entirety by reference.

Examples of other additional layers of materials comprise metals (such as those which might be used to form via fills or printed circuits and also those included in U.S. Pat. Nos. 5,780,755; 6,113,781; 6,348,139 and 6,332,233 all of which are incorporated herein in their entirety), metal diffusion layers, mask layers, anti-reflective coatings layers, adhesion promoter layers and the like.

The compounds, coatings, films, materials and the like described herein may be used to become a part of, form part of or form an electronic component and/or semiconductor component. As used herein, the term "electronic component" also means any device or part that can be used in a circuit to obtain some desired electrical action. Electronic components contemplated herein may be classified in many different ways, including classification into active components and passive components. Active components are electronic components capable of some dynamic function, such as amplification, oscillation, or signal control, which usually requires a power source for its operation. Examples are bipolar transistors, field-effect transistors, and integrated circuits. Passive components are electronic components that are static in operation, i.e., are ordinarily incapable of amplification or oscillation, and usually require no power for their characteristic operation. Examples are conventional resistors, capacitors, inductors, diodes, rectifiers and fuses.

Electronic components contemplated herein may also be classified as conductors, semiconductors, or insulators. Here, conductors are components that allow charge carriers (such as electrons) to move with ease among atoms as in an electric current. Examples of conductor components are circuit traces and vias comprising metals. Insulators are components where the function is substantially related to the ability of a material to be extremely resistant to conduction of current, such as a material employed to electrically separate other components, while semiconductors are components having a function that is substantially related to the ability of a material to conduct current with a natural resistivity between conductors and insulators. Examples of semiconductor components are transistors, diodes, some lasers, rectifiers, thyristors and photo-sensors.

Electronic components contemplated herein may also be classified as power sources or power consumers. Power source components are typically used to power other components, and include batteries, capacitors, coils, and fuel cells. Power consuming components include resistors, transistors, integrated circuits (ICs), sensors, and the like.

Still further, electronic components contemplated herein may also be classified as discreet or integrated. Discreet components are devices that offer one particular electrical property concentrated at one place in a circuit. Examples are resistors, capacitors, diodes, and transistors. Integrated components are combinations of components that that can provide multiple electrical properties at one place in a circuit. Examples are integrated circuits in which multiple components and connecting traces are combined to perform multiple or complex functions such as logic.

EXAMPLES

Example 1

About 1 gram of fluoroaliphatic polymeric ester surfactant was dissolved at room temperature and pressure in a co-solvent of about 4.5 grams of propylene glycol monomethyl ether acetate (PGMEA) and about 4.5 grams of 2-propanol. About 10 grams of low molecular weight cresol novolac-based resin (MW=about 1500, Mn=800) was dissolved under ambient conditions in about 15 grams propylene glycol monomethyl ether acetate. A loading of about 5% in weight of such fluoroaliphatic polymeric ester surfactant solution is added to low-molecular weight, low polydispersity cresol novolac-based resin solution and further diluted with about 10 grams of propylene glycol monomethyl ether acetate. This formulated mixture is applied to patterned substrate by spin coating.

Subsequent to propylene glycol monomethyl ether acetate surface-conditioning, the nozzle moves from wafer edge to center and the solution is radially applied to the substrate, which is then spun at gradually increased speeds ranging from about 100 RPM to about 2500 RPM. The coated substrate is placed in two hot plates at a temperature of about 160° C. and about 200° C. for about 90 seconds each.

By using these modified polymeric solutions, the thickness difference between the topography and open field area has been significantly reduced and 50% improvement in film planarization property has been achieved.

Example 2

About 106.2 g of a low molecular weight (1500 amu) o-cresol novolac polymer was dissolved 159.4 g of propylene glycol methyl ether acetate to yield 265.6 g of a cresol novolac solution. 1.66 g of a fluoroaliphatic polymeric ester surfactant solution with a molecular weight of about 5500-8500 amu, and 7.47 g propylene glycol methyl ether acetate and 7.47 g 2-propanol, was added under ambient conditions to 265.5 g of the cresol novolac polymer solution. The resulting polymeric solution was then dispensed onto a patterned test wafer, was dispensed from wafer edge to center and spun at gradually increased speeds ranging from 100 RPM to 2500 RPM. The coated substrate is placed in two hot plates at a temperature of about 160 C and about 200 C for about 90 seconds.

The average film thickness measured was 2.03 micrometers, with a standard deviation of 28 nanometers (0.68% of the average thickness). The resultant coated wafer measured thickness uniformity with disparity between topography and open area of 600 nanometers at wafer center.

Example 3

Comparative

About 106.2 g of a low molecular weight (1500 amu) o-cresol novolac polymer was dissolved 159.4 g of propylene glycol methyl ether acetate to yield 265.6 g of a cresol novolac solution. 1.66 g of a fluoroaliphatic polymeric ester surfactant solution with a molecular weight of about 5500-8500 amu, and 14.9 g ethyl lactate, was added under ambient conditions to 265.5 g of the cresol novolac polymer solution. The resulting polymeric solution was then dispensed onto an patterned test wafer, was dispensed from wafer edge to center and spun at gradually increased speeds ranging from 100 RPM to 2500 RPM. The coated substrate is placed in two hot plates at a temperature of about 160 C and about 200 C for about 90 seconds.

The average film thickness measured was 2.05 micrometers, with a standard deviation of 18 nanometers (0.44% of the average thickness). The resultant coated wafer measured thickness uniformity with disparity between topography and open area of 1200 nanometer at wafer center.

Example 4

Comparative

About 106.2 g of a low molecular weight (1500 amu) o-cresol novolac polymer was dissolved 159.4 g of propylene glycol methyl ether acetate to yield 265.6 g of a cresol novolac solution. 1.66 g of a fluoroaliphatic polymeric ester surfactant solution with a molecular weight of about 5500-8500 amu, and 14.9 g propylene glycol methyl ether acetate, was added under ambient conditions to 265.5 g of the cresol novolac polymer solution. The resulting polymeric solution was then dispensed onto an patterned test wafer, was dispensed from wafer edge to center and spun at gradually increased speeds ranging from 100 RPM to 2500 RPM. The coated substrate is placed in two hot plates at a temperature of about 160 C and about 200 C for about 90 seconds.

The average film thickness measured was 2.06 micrometers, with a standard deviation of 19 nanometers (0.46% of the average thickness). The resultant coated wafer measured thickness uniformity with disparity between topography and open area of 750 nanometer at wafer center.

Example 5

About 106.2 g of a low molecular weight (950 amu) phenolic novolac polymer was dissolved 159.4 g of propylene glycol methyl ether acetate to yield 265.6 g of a cresol novolac solution. 1.66 g of a fluoroaliphatic polymeric ester surfactant solution with a molecular weight of about 5500-8500 amu, and 7.47 g propylene glycol methyl ether acetate and 7.47 g 2-propanol, was added under ambient conditions to 265.5 g of the cresol novolac polymer solution. The resulting polymeric solution was then dispensed onto an patterned test wafer, was dispensed from wafer edge to center and spun at gradually increased speeds ranging from 100 RPM to 2500 RPM. The coated substrate is placed in two hot plates at a temperature of about 160 C and about 200 C for about 90 seconds.

The resultant coated wafer measured thickness uniformity with disparity between topography and open area of 830 nanometers at the wafer center.

Example 6

Comparative

About 106.2 g of a low molecular weight (950 amu) phenolic novolac polymer was dissolved 159.4 g of propylene glycol methyl ether acetate to yield 265.6 g of a cresol novolac solution. 1.66 g of a fluoroaliphatic polymeric ester surfactant solution with a molecular weight of about 5500-8500 amu, and 14.9 g ethyl lactate, was added under ambient conditions to 265.5 g of the cresol novolac polymer solution.

The resulting polymeric solution was then dispensed onto an patterned test wafer, was dispensed from wafer edge to center and spun at gradually increased speeds ranging from 100 RPM to 2500 RPM. The coated substrate is placed in two hot plates at a temperature of about 160 C and about 200 C for about 90 seconds.

The resultant coated wafer measured thickness uniformity with disparity between topography and open area of 900 nanometer at wafer center.

Example 7

About 106.2 g of a low molecular weight (1300 amu) phenolic novolac polymer was dissolved 159.4 g of propylene glycol methyl ether acetate to yield 265.6 g of a cresol novolac solution. 1.66 g of a fluoroaliphatic polymeric ester surfactant solution with a molecular weight of about 5500-8500 amu, and 7.47 g propylene glycol methyl ether acetate and 7.47 g 2-propanol, was added under ambient conditions to 265.5 g of the cresol novolac polymer solution. The resulting polymeric solution was then dispensed onto an patterned test wafer, was dispensed from wafer edge to center and spun at gradually increased speeds ranging from 100 RPM to 2500 RPM. The coated substrate is placed in two hot plates at a temperature of about 160 C and about 200 C for about 90 seconds.

Example 7

Comparative

About 106.2 g of a low molecular weight (1300 amu) phenolic novolac polymer was dissolved 159.4 g of propylene glycol methyl ether acetate to yield 265.6 g of a cresol novolac solution. 1.66 g of a fluoroaliphatic polymeric ester surfactant solution with a molecular weight of about 5500-8500 amu, and 14.9 g ethyl lactate, was added under ambient conditions to 265.5 g of the cresol novolac polymer solution. The resulting polymeric solution was then dispensed onto an patterned test wafer, was dispensed from wafer edge to center and spun at gradually increased speeds ranging from 100 RPM to 2500 RPM. The coated substrate is placed in two hot plates at a temperature of about 160 C and about 200 C for about 90 seconds.

The resultant coated wafer measured thickness uniformity with disparity between topography and open area of 900 nanometer at wafer center.

Example 8

Comparative to Example 2

About 106.2 g of a low molecular weight (1500 amu) o-cresol novolac polymer was dissolved 159.4 g of propylene glycol methyl ether acetate to yield 265.6 g of a cresol novolac solution. 3.32 g of a fluoroaliphatic polymeric ester surfactant solution with a molecular weight of about 5500-8500 amu, and 14.9 g propylene glycol methyl ether acetate and 14.9 g 2-propanol, was added under ambient conditions to 265.5 g of the cresol novolac polymer solution. The resulting polymeric solution was then dispensed onto an patterned test wafer, was dispensed from wafer edge to center and spun at gradually increased speeds ranging from 100 RPM to 2500 RPM. The coated substrate is placed in two hot plates at a temperature of about 160 C and about 200 C for about 90 seconds.

The average film thickness measured was 2.03 micrometers, with a standard deviation of 15 nanometers (0.37% of the average thickness). The resultant coated wafer measured thickness uniformity with disparity between topography and open area of 200 nanometer at wafer center.

Example 9

Comparative to Example 2

About 106.2 g of a low molecular weight (1500 amu) o-cresol novolac polymer was dissolved 159.4 g of propylene glycol methyl ether acetate to yield 265.6 g of a cresol novolac solution. 1.66 g of a fluoroaliphatic polymeric ester surfactant solution with a molecular weight of about 5500-8500 amu, and 9.7 g propylene glycol methyl ether acetate and 5 g 2-propanol, was added under ambient conditions to 265.5 g of the cresol novolac polymer solution. The resulting polymeric solution was then dispensed onto an patterned test wafer, was dispensed from wafer edge to center and spun at gradually increased speeds ranging from 100 RPM to 2500 RPM. The coated substrate is placed in two hot plates at a temperature of about 160 C and about 200 C for about 90 seconds.

The average film thickness measured was 2.1 micrometers, with a standard deviation of 15 nanometers (0.36% of the average thickness). The resultant coated wafer measured thickness uniformity with disparity between topography and open area of 480 nanometer at wafer center.

Example 10

Example 10 shows a comparison study between a novolac-based polymer composition, such as those described herein (Accuflo™ 2025) and a second novolac-based polymer composition, also similar to those described herein (Accuflo™ 2027 and/or T2027). Along with the novolac-based polymer (structural constituent), Accuflo™ 2025 comprises 90% PGMEA and 10% ethyl lactate as a solvent system. In addition, along with the novolac-based polymer (structural constituent), Accuflo™ 2027 comprises 92% PGMEA and 8% 2-propanol.

FIG. 1 shows the fluid property comparison from solution for the two compositions at about room temperature (RT) and about 40° C. It can be seen in this Figure that the Accuflo™ 2027 composition reduces the apparent viscosity by about 25% because of the minor composition change in solvent system.

Figure 2:
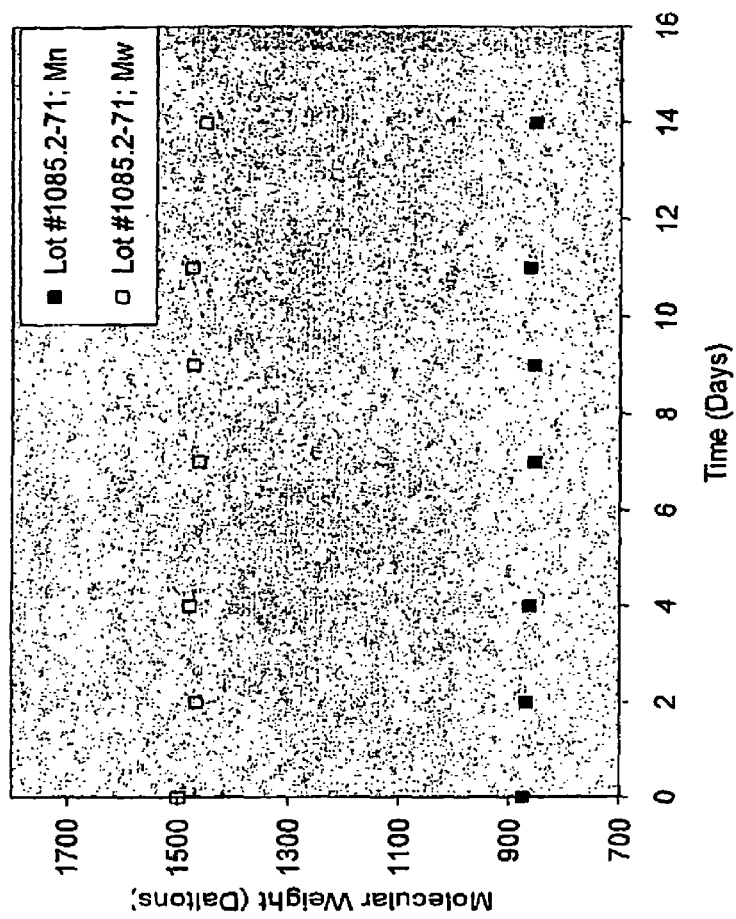
FIG. 2 shows structural information for a contemplated planarization composition.
Figure 3:
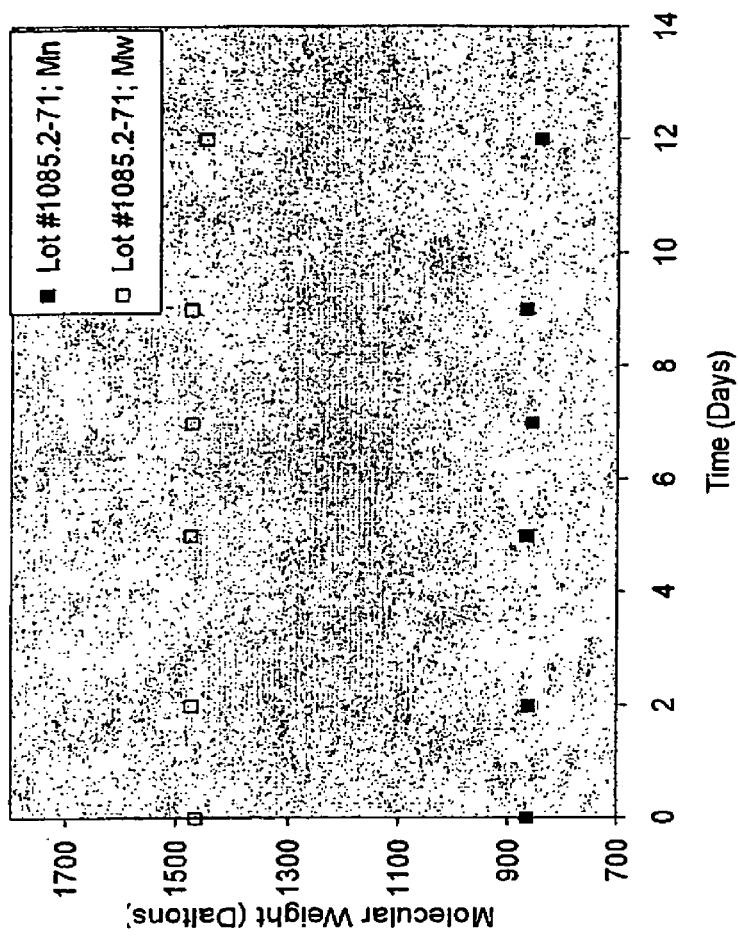
FIG. 3 shows structural information for a contemplated planarization composition.

FIGS. 2 and 3, along with Table 1, shows the structural information for the composition once the starting composition has been deposited onto a surface or wafer and baked and/or cured. The aging experiments were conducted at about room temperature and at about 40° C. The Cauchy coefficient for Accuflo™ 2027 were calculated when this composition was baked at about 160° C.-200° C. for about 120 seconds in air. The coefficients that were valid for the wavelength ($\lambda$) range from about 3500 Å to about 10,000 Å were as follows:

A(n)=1.552
B(n)=1.76E+6 Å$^2$
C(n)=1.90E+12 Å$^4$

The refractive index is calculated in the valid wavelength range using the folio formula:

$$n(\text{lambda})=A(n)+B(n)/\text{lambda}^2+C(n)/\text{lambda}^4$$

The thickness of the Accuflo™ 2027 was about 20347 Å. The thickness of the Accuflo™ 2025 in the comparison study was measured to be about 19782 Å. In the comparison study, the coefficients that were valid for Accuflo™ 2025 were:

A(n)=1.588
B(n)=1.24E+6 Å$^2$
C(n)=2.34E+12 Å$^4$

Figure 4:
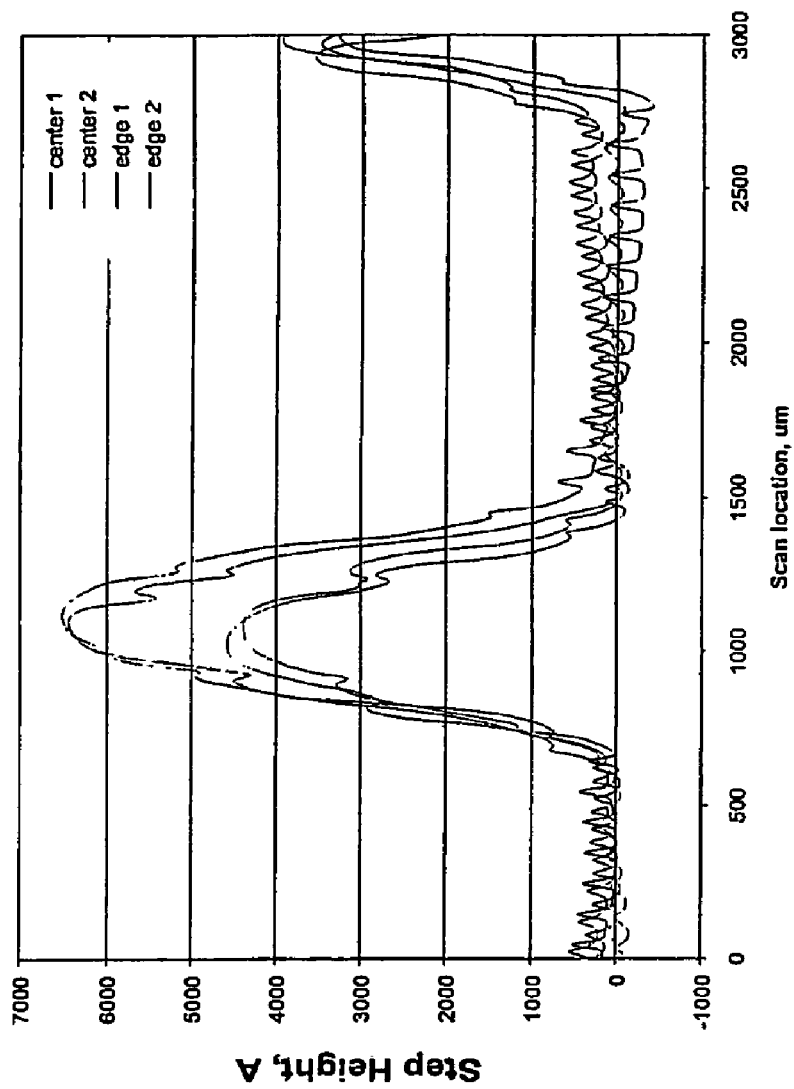
FIG. 4 shows planarization performance of a contemplated planarization composition.
Figure 5:
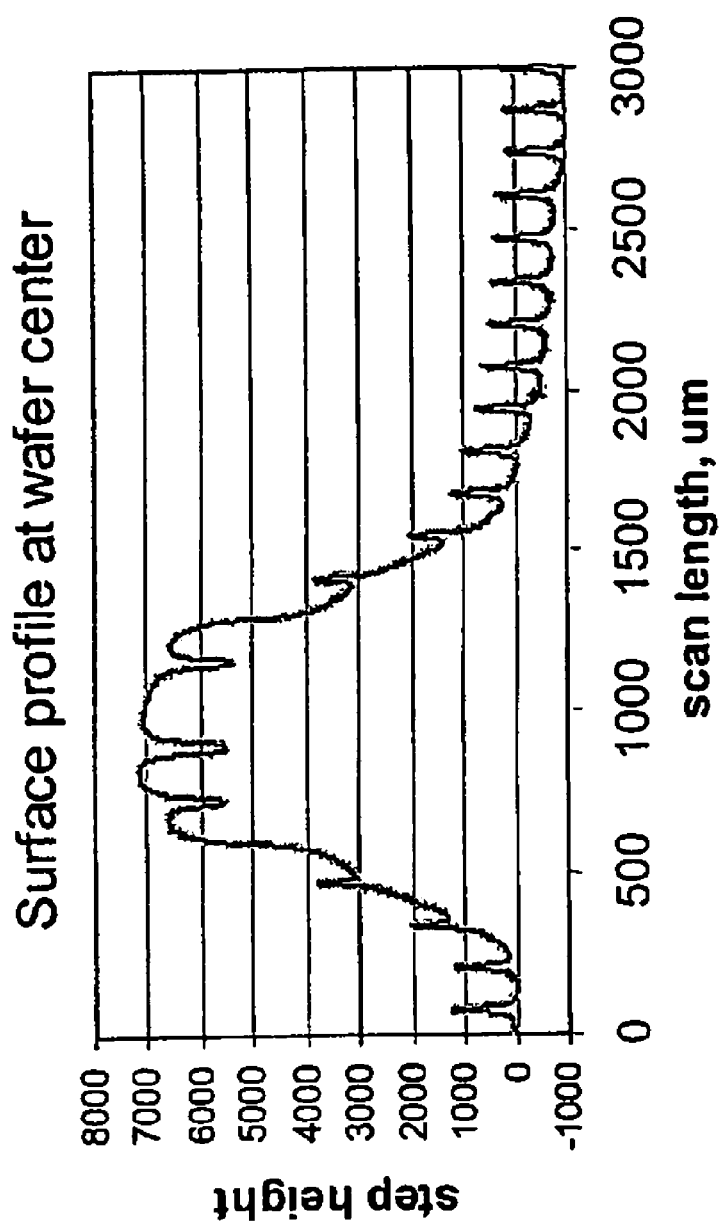
FIG. 5 shows planarization performance of a contemplated planarization composition.
Figure 6:
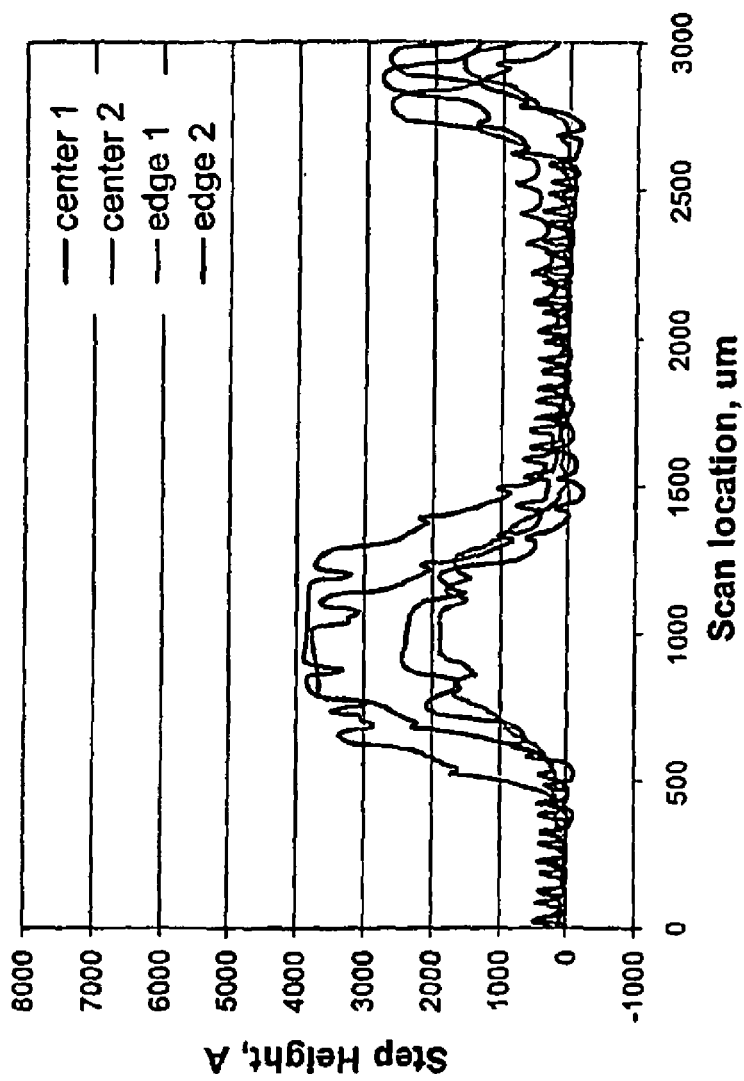
FIG. 6 shows planarization performance of a contemplated planarization composition.
Figure 7:
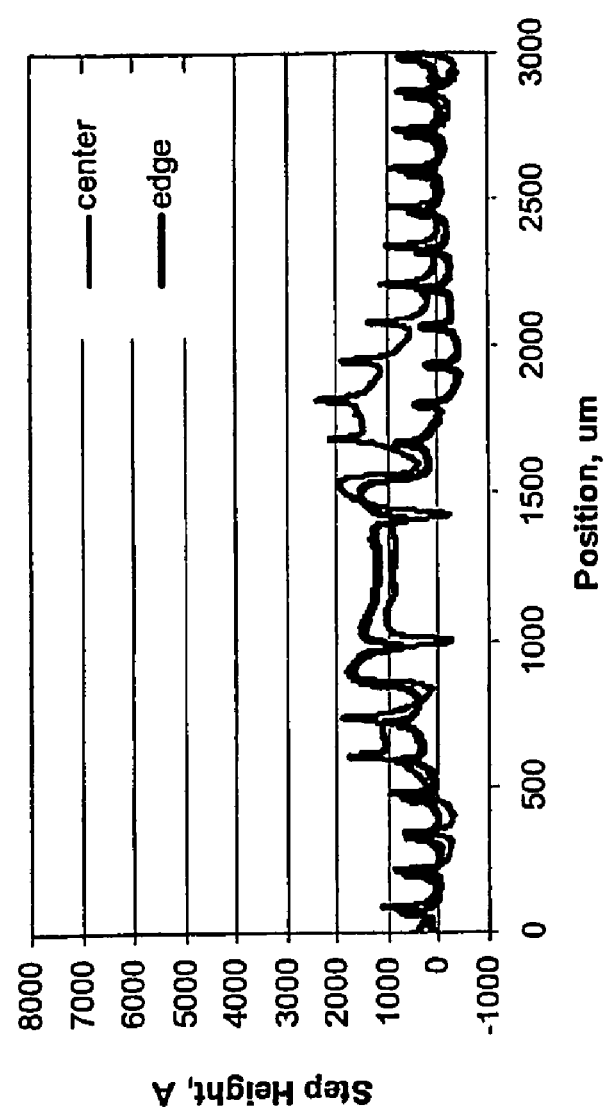
FIG. 7 shows planarization performance of a contemplated planarization composition.

FIGS. 4 and 5, along with Tables 2-7 show the planarization performance for the Accuflo™ 2025 composition tested in two different laboratories. FIGS. 6 and 7, along with Tables 8-13 show the planarization performance for the Accuflo™ 2027 composition tested in two different laboratories.

Table 14 shows the TMAH solvent resistance of the Accuflo™ 2027 when baked at about 160° C. to about 230° C. for about 90 seconds in ambient air. This solvent resistance is identical for all practical purposes to the solvent resistance for Accuflo™ 2025.

Figure 8:
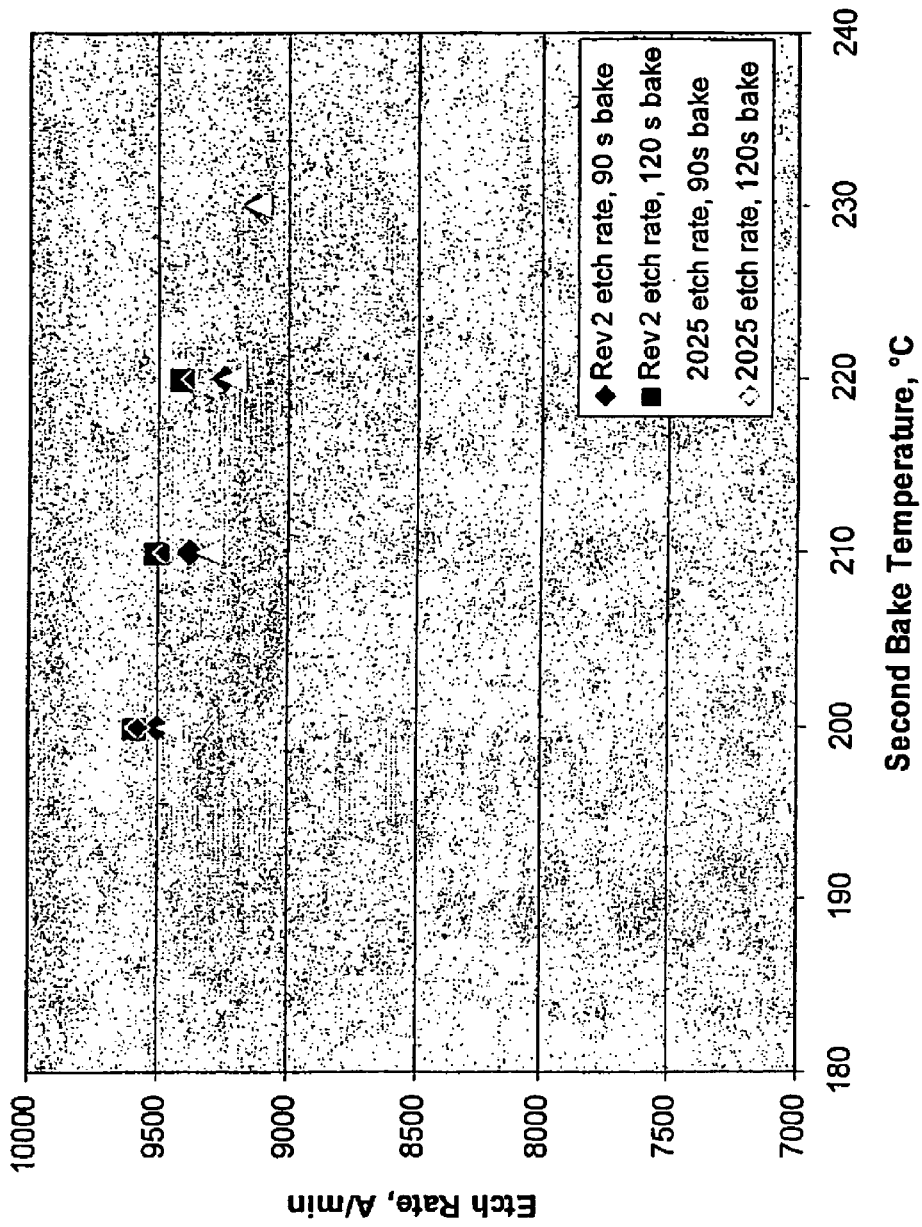
FIG. 8 shows plasma etch rates of a contemplated planarization composition.

FIG. 8 shows that both Accuflo™ 2025 and Accuflo™ 2027 have comparable plasma etch rates. A planarization comparison between the two compositions is shown in Table 15.

Figure 9:
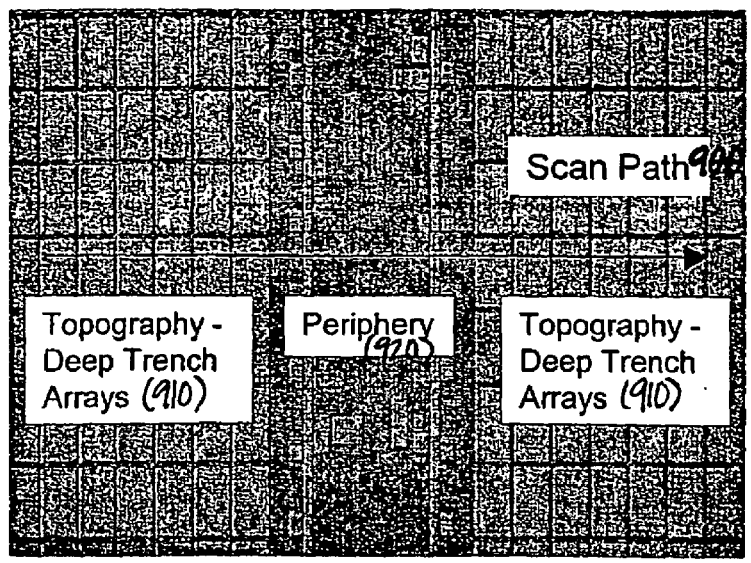
FIG. 9 shows fill and planarization data for a contemplated planarization composition.
Figure 10:
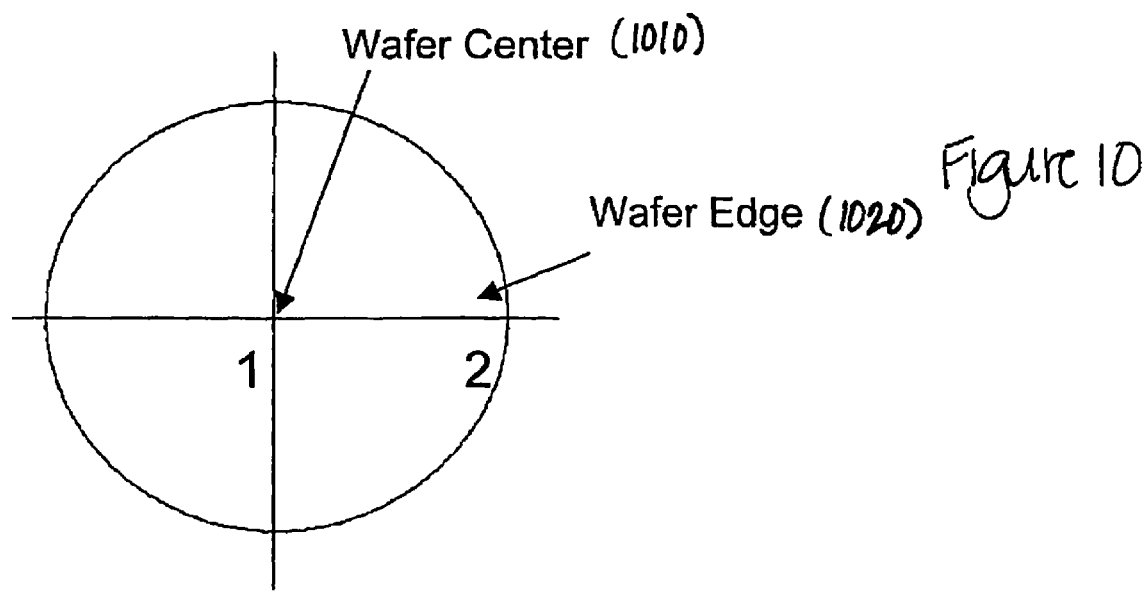
FIG. 10 shows fill and planarization data for a contemplated planarization composition.
Figure 11:
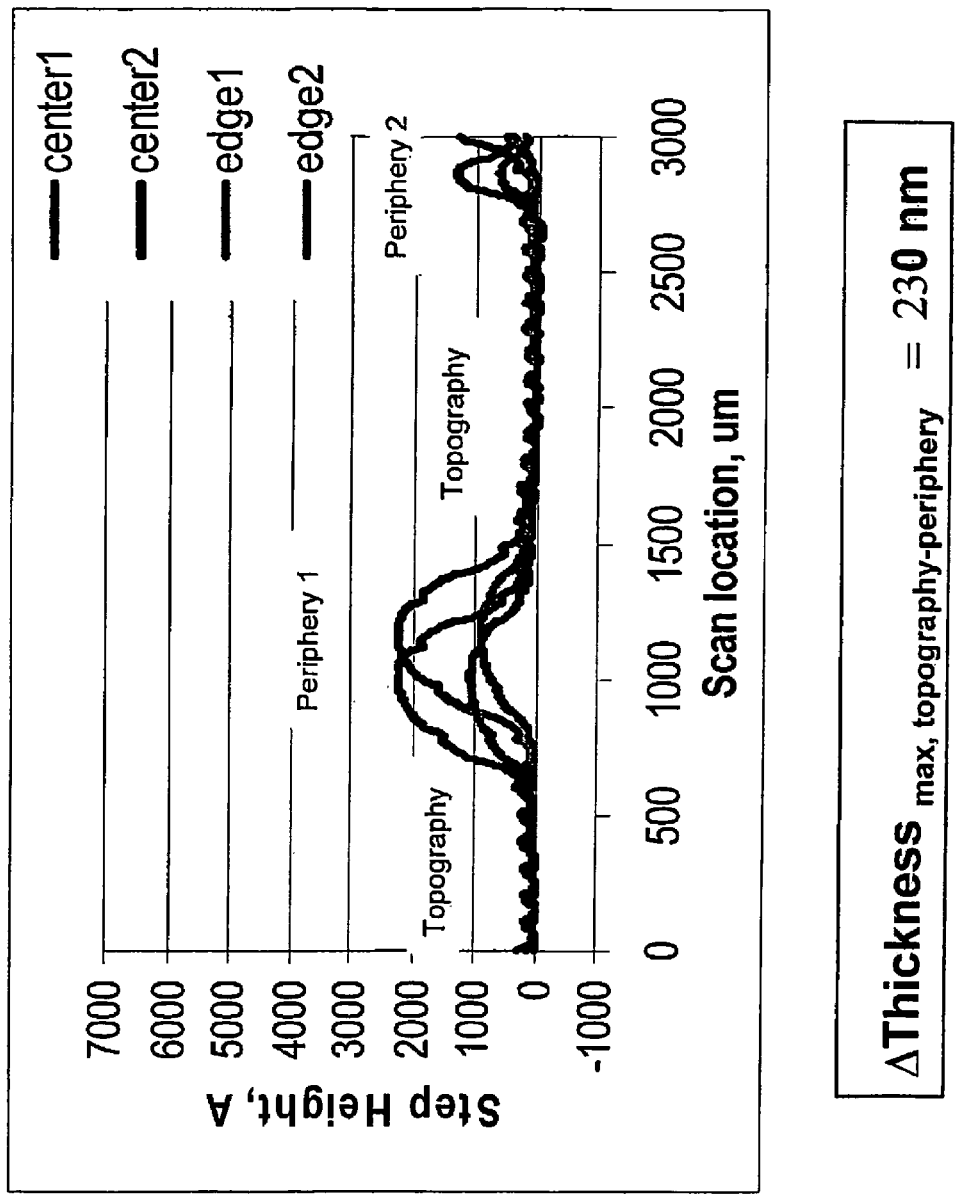
FIG. 11 shows profilometer results for a contemplated planarization composition.

FIGS. 9 and 10 show fill and planarization data collected for the Accuflo™ 2027 composition. FIG. 9 shows the scan path 900, the topography—deep trench arrays 910 and the periphery 920. FIG. 10 shows a schematic of the wafer center 1010 and the wafer edge 1020. Profilometer scan path and two wafer locations were used for this evaluation. Two wafers were used. Analysis of the SEM cross sections were made at three locations: center, mid-wafer and at the edge. FIG. 11 shows the profilometer results. Table 16 shows the SEM cross section results, and Table 17 shows the BOE etch results for this same composition. Accuflo™ 2027 achieves complete resistance to BOE (500:1) at all bake conditions under study. High bake temperatures of 160° C. (100 s)-190° C. (100 s)-200° C. (210 s) is a preferred embodiment to further crosslink polymeric film when concentrated HF etchant is used.

Several conclusions can be drawn from this Example, including the following:

With standard spin process, Accuflo™ 2027 presents superior planarization properties as compared to Accuflo™ 2025 because of reduced viscosity and interfacial surface tension.

Following process development on Accuflo™ 2025, a contemplated process has been implemented for Accuflo™ 2027 to maximize trench fill property, which comprises gradually increase spin method with and without the radial dispense approach and surface conditioning with PGMEA. Greater than 70% enhancement in local and global planarization has been achieved. The thickness bias between trench arrays and support area have been reduced to 250 nm at wafer center and 150 nm at wafer edge.

Bulk film characterization has been conducted on Accuflo™ 2027 and Accuflo™ 2025. Comparable structural (molecular characteristics), physical, process (solvent resistance and plasma etch performance) and optical properties have been observed between the two compositions.

Superior global and local planarization in the deep trench arrays/buffer capacitor area can be achieved by application of Accuflo™ 2027 using contemplated spin processes with bake temperatures of about 160° C. (about 90 s)-about 220° C. (about 90 s) in air ambient. Another optimum bake range is from about 160° C. (about 90 s)-about 180° C. (about 90 s) in air ambient, which leads to moderate crosslinking, and from about 160° C. (about 100 s)-to about 180° C. (about 100 s)-to about 200° C. (about 210 s) in air ambient, which leads to high crosslinking.

Thus, specific embodiments, methods of formation and applications of modified planarization compositions have been disclosed. It should be apparent, however, to those skilled in the art that many more modifications besides those already described are possible without departing from the inventive concepts herein. The inventive subject matter, therefore, is not to be restricted except in the spirit of the disclosure herein. Moreover, in interpreting the specification and claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

We claim:

1. A film comprising a planarization composition wherein the planarization composition consists of:
   an o-cresol-based polymer compound and a resol phenolic resin;
   at least one surfactant; and
   a solvent system consisting of at least one solvent, wherein at least some of the solvent system is removed.

2. A layered component, comprising:
   a substrate having a surface topography; and
   a planarization composition consisting of:
   an o-cresol-based polymer compound and a resol phenolic resin;
   at least one surfactant; and
   a solvent system consisting of at least one solvent, and wherein the composition is coupled to the substrate.

3. The layered component of claim 2, further comprising at least one additional layer of material or film.

4. A layered component, comprising:
   a substrate having a surface topography; and
   a layer comprising the film of claim 1, wherein the layer is coupled to the substrate.

5. The layered component of claim 4, further comprising at least one additional layer of material or film.

6. A method of forming a film, comprising:
   providing a planarization composition consisting of:
   an o-cresol-based polymer compound and a resol phenolic resin;
   at least one surfactant; and
   a solvent system consisting of at least one solvent, and evaporating at least part of the solvent system to form a film.

7. The method of claim 6, wherein evaporating at least part of the solvent system comprises applying a continuous source to the planarization composition.

8. The method of claim 7, wherein the continuous source comprises a heat source.

9. The method of claim 8, wherein the continuous source comprises an infrared source, an ultraviolet source, an electron-beam source and combinations thereof.

* * * * *